(12) United States Patent
Tandon et al.

(10) Patent No.: US 11,749,790 B2
(45) Date of Patent: Sep. 5, 2023

(54) SEGMENTED LED WITH EMBEDDED TRANSISTORS

(71) Applicant: Lumileds LLC, San Jose, CA (US)

(72) Inventors: Ashish Tandon, Sunnyvale, CA (US); Luke Gordon, Santa Barbara, CA (US); Yu-Chen Shen, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 594 days.

(21) Appl. No.: 16/225,934

(22) Filed: Dec. 19, 2018

(65) Prior Publication Data

US 2019/0189879 A1 Jun. 20, 2019

Related U.S. Application Data

(60) Provisional application No. 62/608,295, filed on Dec. 20, 2017.

(30) Foreign Application Priority Data

Feb. 7, 2018 (EP) ..................................... 18155455

(51) Int. Cl.
  *H01L 33/62*  (2010.01)
  *H01L 33/44*  (2010.01)
  *H01L 27/15*  (2006.01)

(52) U.S. Cl.
  CPC ............ *H01L 33/62* (2013.01); *H01L 27/156* (2013.01); *H01L 33/44* (2013.01); *H01L 2933/0066* (2013.01)

(58) Field of Classification Search
  CPC ...... H01L 27/156; H01L 33/385; H01L 33/62
  See application file for complete search history.

(56) References Cited

U.S. PATENT DOCUMENTS

| | | | |
|---|---|---|---|
| 5,103,270 A | * | 4/1992 | Sato .................... H01L 33/0025 257/103 |
| 5,696,389 A | * | 12/1997 | Ishikawa ................. H01L 33/20 257/99 |
| 5,940,683 A | | 8/1999 | Holm et al. |
| 6,410,942 B1 | | 6/2002 | Thibeault et al. |
| 6,638,872 B1 | | 10/2003 | Croswell et al. |
| 7,339,273 B2 | | 3/2008 | Kameyama et al. |
| 8,053,335 B2 | | 11/2011 | Yonehara |
| 8,941,566 B2 | | 1/2015 | Haase |

(Continued)

FOREIGN PATENT DOCUMENTS

| | | |
|---|---|---|
| CN | 102201428 A | 9/2011 |
| CN | 104704634 A | 6/2015 |

(Continued)

*Primary Examiner* — Vincent Wall

(57) ABSTRACT

A device may include a substrate having a first embedded transistor in a first region and a second embedded transistor in a second region. The first region and the second region may be separated by trench extending through at least a portion of an epitaxial layer formed on the substrate. The first embedded transistor may be connected to a first light emitting diode (LED) and the second embedded transistor may be connected to a second LED. A first optical isolation layer may be between the epitaxial layer and the first region of the substrate. A second optical isolation layer may be between the epitaxial layer and the second region of the substrate.

17 Claims, 20 Drawing Sheets

(56) References Cited

U.S. PATENT DOCUMENTS

| | | | |
|---|---|---|---|
| 9,029,175 B2 | 5/2015 | Huang et al. | |
| 9,362,335 B2* | 6/2016 | von Malm | H01L 27/124 |
| 9,461,027 B2 | 10/2016 | Schug | |
| 9,978,727 B2 | 5/2018 | Takeya et al. | |
| 9,997,688 B2 | 6/2018 | Takeya et al. | |
| 10,050,026 B2 | 8/2018 | Takeya et al. | |
| 10,079,264 B2 | 9/2018 | Zhang et al. | |
| 10,374,121 B2* | 8/2019 | Scholz | H01L 33/0075 |
| 10,586,787 B2* | 3/2020 | Negley | H05B 45/00 |
| RE47,981 E | 5/2020 | Sano | |
| 10,685,945 B2 | 6/2020 | Robin et al. | |
| 2004/0027701 A1 | 2/2004 | Ishikawa | |
| 2008/0048196 A1 | 2/2008 | Strittmatter et al. | |
| 2008/0230765 A1* | 9/2008 | Yoon | H01L 27/156 257/13 |
| 2010/0001257 A1 | 1/2010 | Yu et al. | |
| 2010/0201248 A1* | 8/2010 | Harada | F21S 41/148 313/483 |
| 2010/0327386 A1* | 12/2010 | Nagai | H01L 27/14689 257/437 |
| 2011/0127565 A1* | 6/2011 | Son | H01L 33/385 257/99 |
| 2011/0133221 A1* | 6/2011 | Choi | H01L 33/44 257/88 |
| 2011/0233575 A1* | 9/2011 | Huang | H01L 33/62 257/89 |
| 2011/0254039 A1* | 10/2011 | Kim | H01L 24/97 257/98 |
| 2012/0037885 A1* | 2/2012 | Schardt | H01L 27/156 257/13 |
| 2012/0050694 A1* | 3/2012 | Huang | G03B 21/2033 353/38 |
| 2012/0182738 A1* | 7/2012 | Jeong | H01L 27/156 362/249.02 |
| 2013/0264600 A1* | 10/2013 | Lee | H01L 24/94 257/98 |
| 2014/0077155 A1* | 3/2014 | Hayashi | H01L 27/3204 257/13 |
| 2014/0098556 A1* | 4/2014 | von Malm | F21S 41/143 362/543 |
| 2014/0306244 A1* | 10/2014 | Oraw | H01L 33/40 257/88 |
| 2015/0009677 A1 | 1/2015 | Catalano | |
| 2015/0279902 A1 | 10/2015 | Von Malm et al. | |
| 2016/0027765 A1* | 1/2016 | von Malm | H01L 27/156 257/72 |
| 2016/0190400 A1* | 6/2016 | Jung | H01L 33/0095 362/97.1 |
| 2016/0218128 A1 | 7/2016 | Shieh et al. | |
| 2017/0069609 A1* | 3/2017 | Zhang | H01S 5/183 |
| 2017/0243860 A1 | 8/2017 | Hong et al. | |
| 2017/0358563 A1 | 12/2017 | Cho et al. | |
| 2018/0019369 A1* | 1/2018 | Cho | H01L 25/0753 |
| 2018/0074372 A1* | 3/2018 | Takeya | H01L 27/156 |
| 2018/0090540 A1* | 3/2018 | Von Malm | H01L 33/12 |
| 2018/0174519 A1* | 6/2018 | Kim | H01L 33/42 |
| 2018/0233535 A1* | 8/2018 | Bono | H01L 27/1021 |
| 2018/0272605 A1 | 9/2018 | Gmeinwieser et al. | |
| 2018/0283642 A1 | 10/2018 | Liao et al. | |
| 2018/0331153 A1 | 11/2018 | Robin et al. | |
| 2018/0371315 A1 | 12/2018 | Hofmann et al. | |
| 2019/0355874 A1* | 11/2019 | Herner | H01L 33/504 |

FOREIGN PATENT DOCUMENTS

| | | |
|---|---|---|
| JP | 63-120487 A | 5/1988 |
| JP | 2010-114112 A | 5/2010 |
| JP | 2011-211189 A | 10/2011 |
| JP | 5315645 B2 | 10/2013 |
| JP | 2016-502123 A | 1/2016 |
| JP | 2018-538554 A | 12/2018 |
| TW | 200847490 A | 12/2008 |
| TW | 200849169 A | 12/2008 |
| TW | 201044568 A | 12/2010 |
| TW | 201110416 A | 3/2011 |
| TW | 201133814 A | 10/2011 |
| TW | 201414023 A | 4/2014 |
| TW | 201448289 A | 12/2014 |
| TW | 201732770 A | 9/2017 |
| TW | 201724442 A | 7/2020 |
| WO | 2010/123809 | 10/2010 |
| WO | 2017/037530 | 3/2017 |
| WO | 2017/045995 A1 | 3/2017 |
| WO | 2017/089676 A1 | 6/2017 |
| WO | 2017/102708 A1 | 6/2017 |
| WO | 2018/091657 A1 | 5/2018 |

* cited by examiner

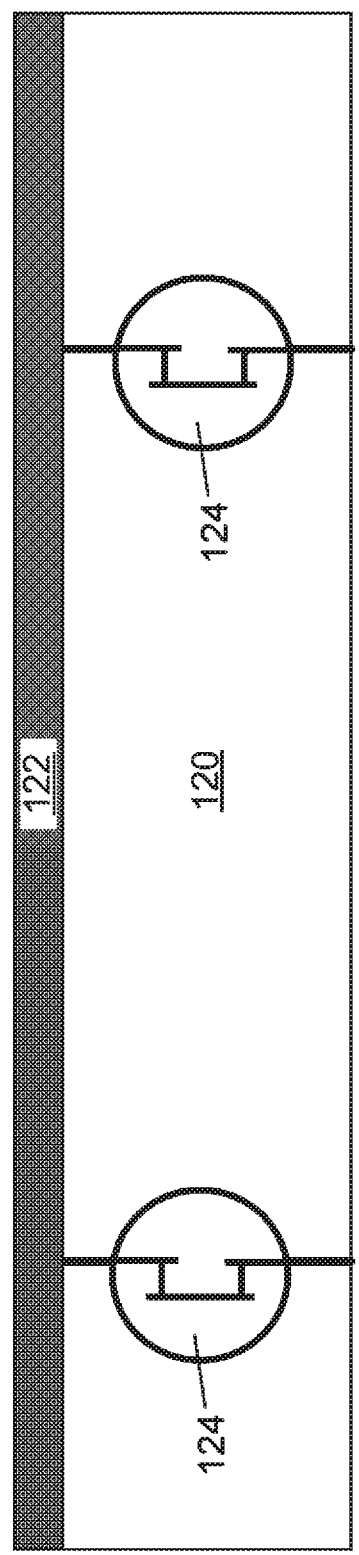

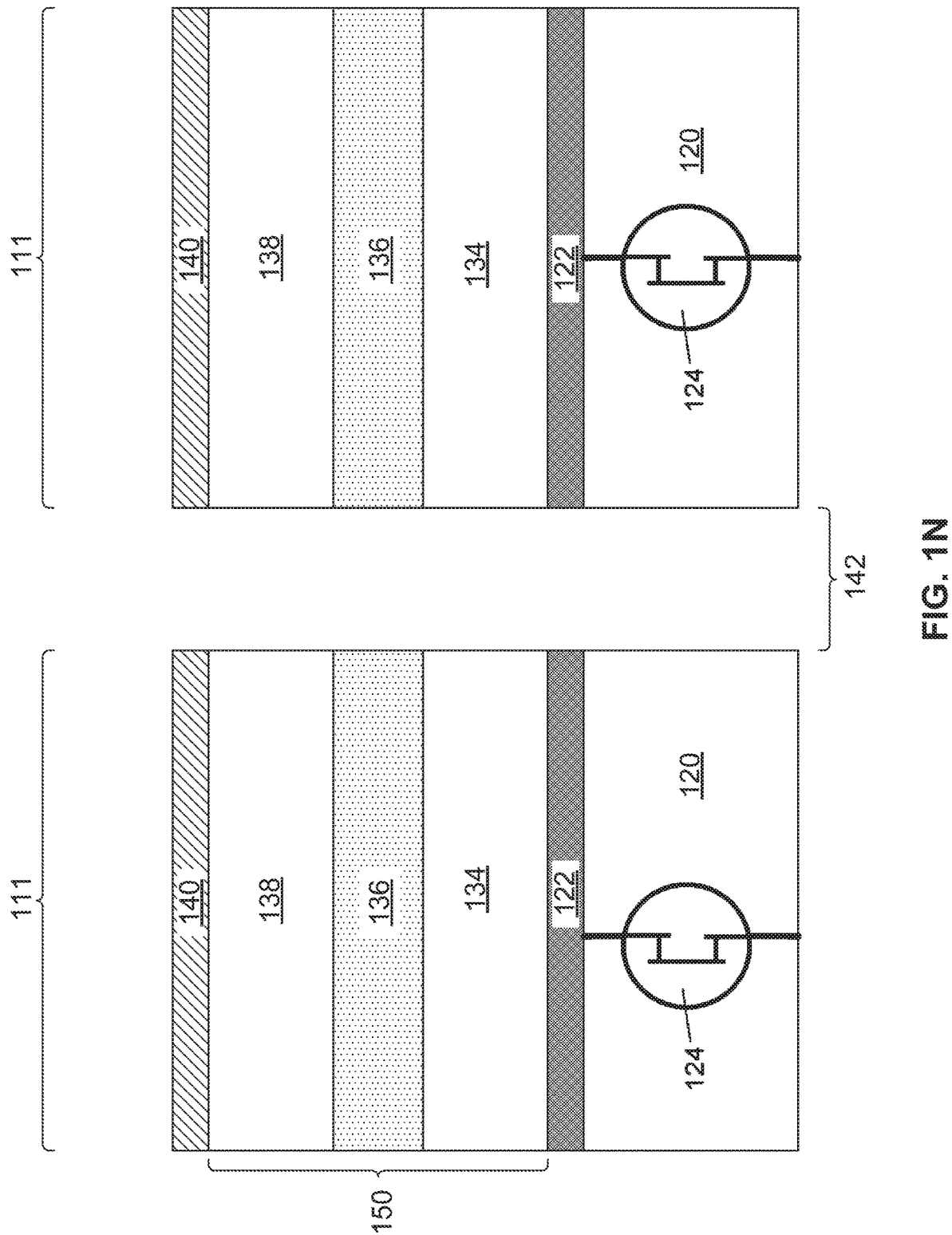

SEGMENTED LED WITH EMBEDDED TRANSISTORS

CROSS REFERENCE TO RELATED APPLICATIONS

This application claims the benefit of U.S. Provisional Application No. 62/608,295 filed on Dec. 20, 2017 and EP Patent Application No. 18155455.1 filed on Feb. 7, 2018, the contents of which are hereby incorporated by reference herein.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, silicon, formed over the substrate, one or more light emitting layers in an active region formed over the n-type layer or layers, and one or more p-type layers doped with, for example, magnesium, formed over the active region. Electrical contacts are formed on the n- and p-type regions.

SUMMARY

A device may include a substrate having a first embedded transistor in a first region and a second embedded transistor in a second region. The first region and the second region may be separated by trench extending through at least a portion of an epitaxial layer formed on the substrate. The first embedded transistor may be connected to a first light emitting device (LED) and the second embedded transistor may be connected to a second LED. A first optical isolation layer may be between the epitaxial layer and the first region of the substrate. A second optical isolation layer may be between the epitaxial layer and the second region of the substrate.

BRIEF DESCRIPTION OF THE DRAWINGS

A more detailed understanding can be had from the following description, given by way of example in conjunction with the accompanying drawings wherein:

FIG. 1D is a cross section view of an optical isolation layer formed on a substrate having embedded transistors;

FIG. 1I is a cross section view illustrating the formation of a trench;

FIG. 1N is a cross section view illustrating the formation of a trench;

FIG. 1O is a cross section view illustrating forming a contact in the trench;

DETAILED DESCRIPTION

Figure 1A:
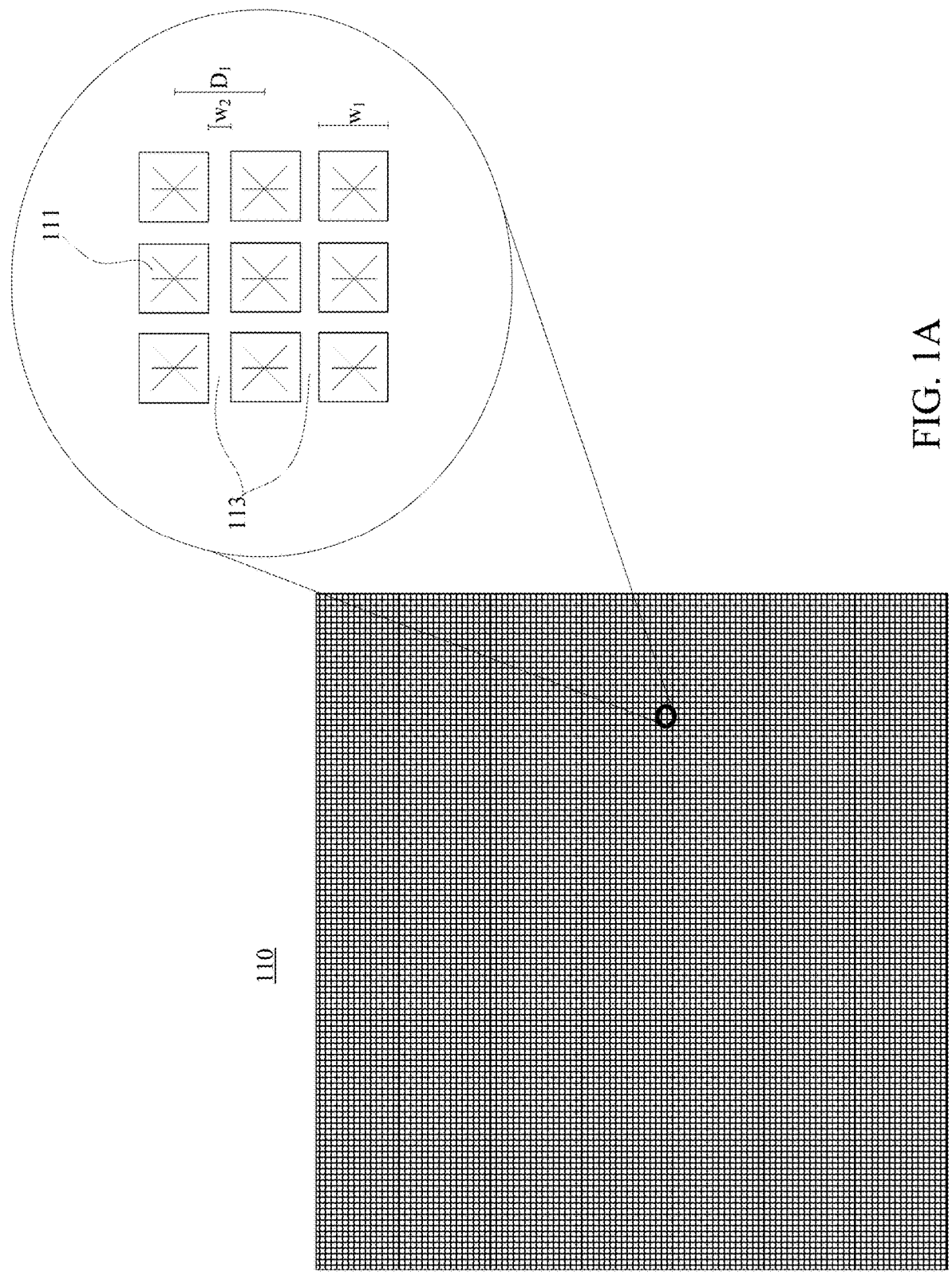
FIG. 1A is a top view illustration of an LED array with an exploded portion.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Figure 1B:
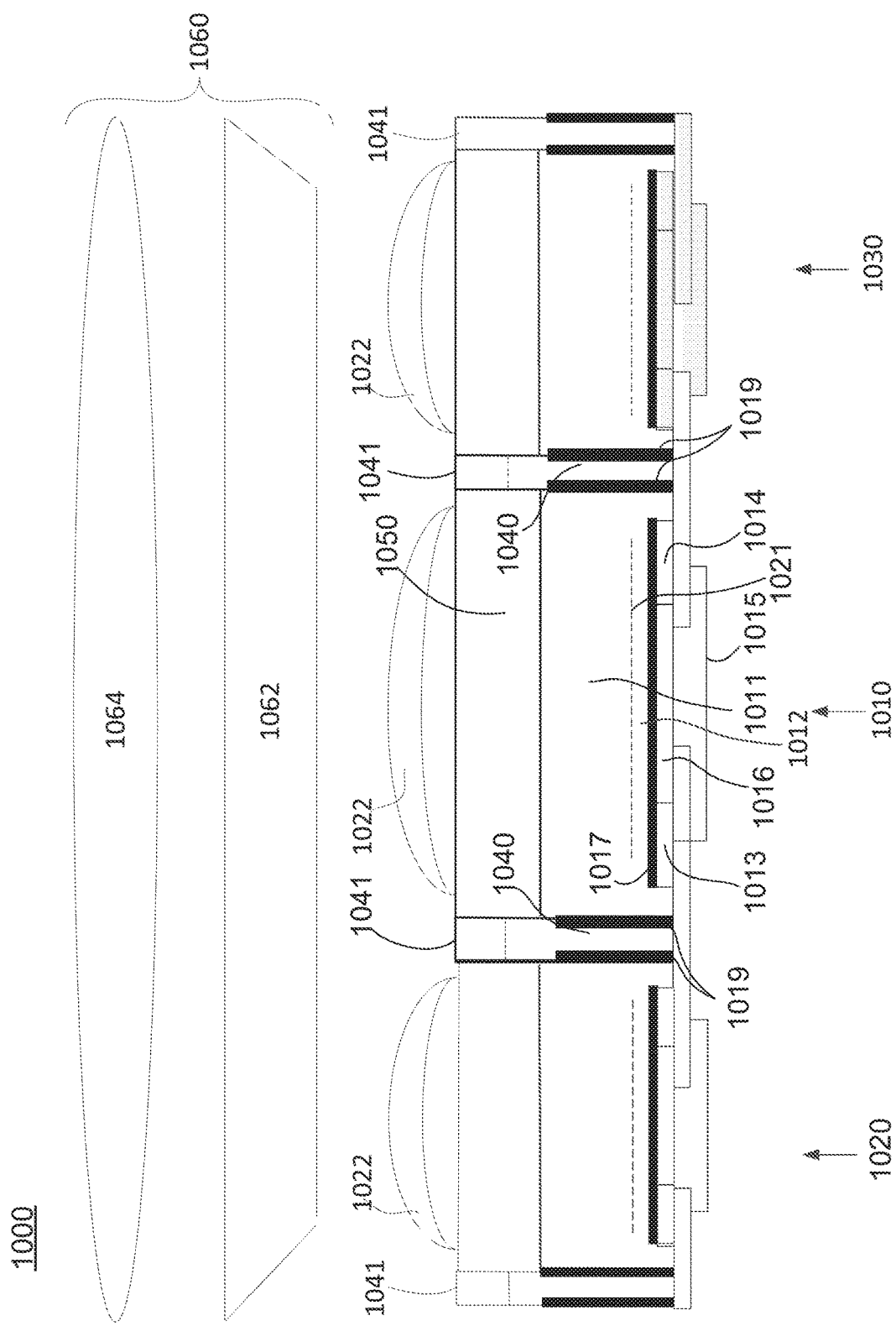
FIG. 1B is a cross sectional illustration of an LED array with trenches.
Figure 1C:
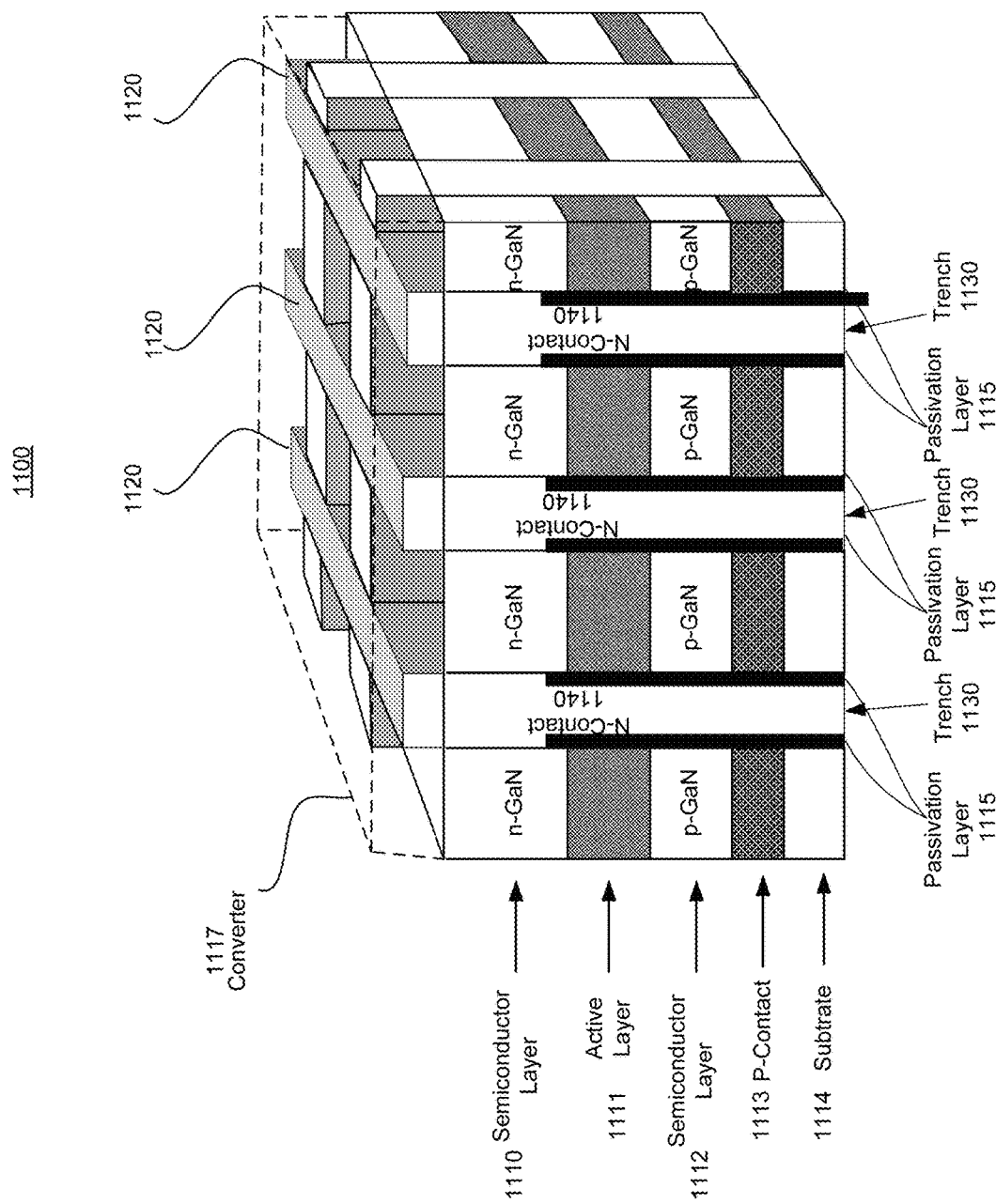
FIG. 1C is a perspective illustration of another LED array with trenches.

According to embodiments of the disclosed subject matter, LED arrays (e.g., micro LED arrays) may include an array of pixels as shown in FIG. 1A, 1B, and/or 1C. LED arrays may be used for any applications such as those requiring precision control of LED array segments. Pixels in an LED array may be individually addressable, may be addressable in groups/subsets, or may not be addressable. In FIG. 1A, a top view of a LED array 110 with pixels 111 is shown. An exploded view of a 3×3 portion of the LED array 110 is also shown in FIG. 1A. As shown in the 3×3 portion exploded view, LED array 110 may include pixels 111 with a width $w_1$ of approximately 1 00 μm or less (e.g., 40 μm). The lanes 113 between the pixels may be separated by a width, $w_2$, of approximately 20 μm or less (e.g., 5 μm). The lanes 113 may provide an air gap between pixels or may contain other material, as shown in FIGS. 1B and 1C and further disclosed herein. The distance $D_1$ from the center of one pixel 111 to the center of an adjacent pixel 111 may be approximately 120 μm or less (e.g., 45 μm). It will be understood that the widths and distances provided herein are examples only, and that actual widths and/or dimensions may vary.

It will be understood that although rectangular pixels arranged in a symmetric matrix are shown in FIGS. 1A, B and C, pixels of any shape and arrangement may be applied to the embodiments disclosed herein. For example, LED array 110 of FIG. 1A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

FIG. 1B shows a cross section view of an example LED array 1000. As shown, the pixels 1010, 1020, and 1030 correspond to three different pixels within an LED array such that a separation sections 1041 and/or n-type contacts 1040 separate the pixels from each other. According to an embodiment, the space between pixels may be occupied by an air gap. As shown, pixel 1010 includes an epitaxial layer 1011 which may be grown on any applicable substrate such as, for example, a sapphire substrate, which may be removed from the epitaxial layer 1011. A surface of the growth layer distal from contact 1015 may be substantially planar or may be patterned. A p-type region 1012 may be located in proximity to a p-contact 1017. An active region 1021 may be disposed adjacent to the n-type region and a p-type region 1012. Alternatively, the active region 1021 may be between a semiconductor layer or n-type region and p-type region 1012 and may receive a current such that the active region 1021 emits light beams. The p-contact 1017 may be in contact with SiO2 layers 1013 and 1014 as well as plated metal (e.g., plated copper) layer 1016. The n type contacts 1040 may include an applicable metal such as Cu. The metal layer 1016 may be in contact with a contact 1015 which may be reflective.

Notably, as shown in FIG. 1B, the n-type contact 1040 may be deposited into trenches 1130 created between pixels 1010, 1020, and 1030 and may extend beyond the epitaxial layer. Separation sections 1041 may separate all (as shown) or part of a wavelength converting layer 1050. It will be understood that a LED array may be implemented without such separation sections 1041 or the separation sections 1041 may correspond to an air gap. The separation sections 1041 may be an extension of the n-type contacts 1040, such that, separation sections 1041 are formed from the same material as the n-type contacts 1040 (e.g., copper). Alternatively, the separation sections 1041 may be formed from a material different than the n-type contacts 1040. According to an embodiment, separation sections 1041 may include reflective material. The material in separation sections 1041 and/or the n-type contact 1040 may be deposited in any applicable manner such as, for example, but applying a mesh structure which includes or allows the deposition of the n-type contact 1040 and/or separation sections 1041. As noted herein, one or more additional layers may coat the separation sections 1041. Such a layer may be a reflective layer, a scattering layer, an absorptive layer, or any other applicable layer. One or more passivation layers 1019 may fully or partially separate the n-contact 1040 from the epitaxial layer 1011.

The epitaxial layer 1011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Similarly, the p-type region 1012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 1050 (e.g., phosphor converted LED, "POLED", etc.) that acts to further modify wavelength of the emitted light to output a light of a second wavelength.

Although FIG. 1B shows an example LED array 1000 with pixels 1010, 1020, and 1030 in an example arrangement, it will be understood that pixels in an LED array may be provided in any one of a number of arrangements. For example, the pixels may be in a flip chip structure, a vertical injection thin film (VTF) structure, a multi-junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 1050 may be in the path of light emitted by active region 1021, such that the light emitted by active region 1021 may traverse through one or more intermediate layers (e.g., a photonic layer). According to embodiments, wavelength converting layer 1050 or may not be present in LED array 1000. The wavelength converting layer 1050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 1050 may be determined based on the material used or application/wavelength for which the LED array 1000 or individual pixels 1010, 1020, and 1030 is/are arranged. For example, a wavelength converting layer 1050 may be approximately 20 µm, 50 µm or 200 µm. The wavelength converting layer 1050 may be provided on each individual pixel, as shown, or may be placed over an entire LED array 1000.

Primary optic 1022 may be on or over one or more pixels 1010, 1020, and/or 1030 and may allow light to pass from the active region 101 and/or the wavelength converting layer 1050 through the primary optic. Light via the primary optic may generally be emitted based on a Lambertian distribution pattern such that the luminous intensity of the light emitted via the primary optic 1022, when observed from an ideal diffuse radiator, is directly proportional to the cosine of the angle between the direction of the incident light and the surface normal. It will be understood that one or more properties of the primary optic 1022 may be modified to produce a light distribution pattern that is different than the Lambertian distribution pattern.

Secondary optics 1060 which include one or both of the lens 1064 and waveguide 1062 may be provided with pixels 1010, 1020, and/or 1030. It will be understood that although secondary optics are discussed in accordance with the example shown in FIG. 1B with multiple pixels, secondary optics may be provided for single pixels. Secondary optics may be used to spread the incoming light (diverging optics), or to gather incoming light into a collimated beam (collimating optics). The waveguide 1062 may be coated with a dielectric material, a metallization layer, or the like and may be provided to reflect or redirect incident light. In alternative embodiments, a lighting system may not include one or more of the following: the wavelength converting layer 1050, the primary optics 1022, the waveguide 1062 and the lens 1064.

Lens 1064 may be formed form any applicable transparent material such as, but not limited to SiC, aluminum oxide, diamond, or the like or a combination thereof. Lens 1064 may be used to modify a beam of light to be input into the lens 1064 such that an output beam from the lens 1064 will efficiently meet a desired photometric specification. Additionally, lens 1064 may serve one or more aesthetic purpose, such as by determining a lit and/or unlit appearance of the multiple LED devices 200B.

FIG. 1C shows a cross section of a three dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-Gan semiconductor layer 1110. It will be understood that this structure is provided as an example only and one or more semiconductor or other applicable layers may be added, removed, or partially added or removed to implement the disclosure provided herein. A converter material 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the converter material 1117 (e.g., as elements 1120) such that the n-contacts 1140, or other applicable material, provide complete or partial optical isolation between the pixels.

Manufacturing small LED pixel systems with control electronics may be costly and difficult. An architecture and process that can cost effectively combine, at wafer scale, transistors and control elements with LED structures may be desirable.

One approach for combining control elements with LED structures may include forming the LED structures on a wafer containing embedded transistors. The transistors may be connected to the LED structures and may be used to control power delivered to LED emitters. The transistors may be connected to each LED emitter and may be connected to one another using a power gated crossbar pattern.

Monolithic segmented LEDs constructed using etched gallium nitride (GaN) mesas is feasible, but has substantial associated processing costs. Elimination of the etched mesa and combination of embedded control elements may reduce edge losses and provide for a more mechanically sound device. The following description includes methods of using embedded transistors and transparent conductors to form monolithic segmented LEDs without the need for etched individual mesas and with reduced structures for control electronics. Apparatuses described herein may include sub-100 μm (e.g., less than 20 μm) to above 300 μm pixels separated by electrically non-conductive lanes having a width less than approximately 1 μm. Control electronics may be incorporated into an underlying substrate, which may be processed to form trenches between each pixel. A common n-contact for the pixels may be provided by a transparent conductor layer.

Referring now to FIG. 1D, a cross section illustrating forming an optical isolation layer 122 on a substrate 120 is shown. The substrate 120 may be a wafer composed of a semiconductor material. In an example, the substrate 120 may be composed of monocrystalline silicon. In another example, the substrate 120 may be composed of silicon in combination with another element, such as, for example, SiGe, SiC, Ge, etc. In another example, the substrate may be composed of III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. The substrate 120 may be similar to the substrate 1114 described above with reference to FIG. 1C and the following description may be applied to the LED array 1100.

The substrate 120 may contain one or more embedded transistors 124. The composition and methods of forming the one or more embedded transistors 124 may be known in the art and any type of embedded transistor may be used. In an example, the one or more embedded transistors 124 may be formed by etching the substrate 120 to form one or more trenches. The one or more trenches may be filled with one or more semiconductor materials to form the embedded transistors. For example, the one or more trenches may be filled with a first type (e.g., n-type) semiconductor material as a source/drain, a second type (e.g., p-type) of semiconductor material as a body, and a dielectric material (e.g., high-k dielectric) as a gate.

Figure 1E:
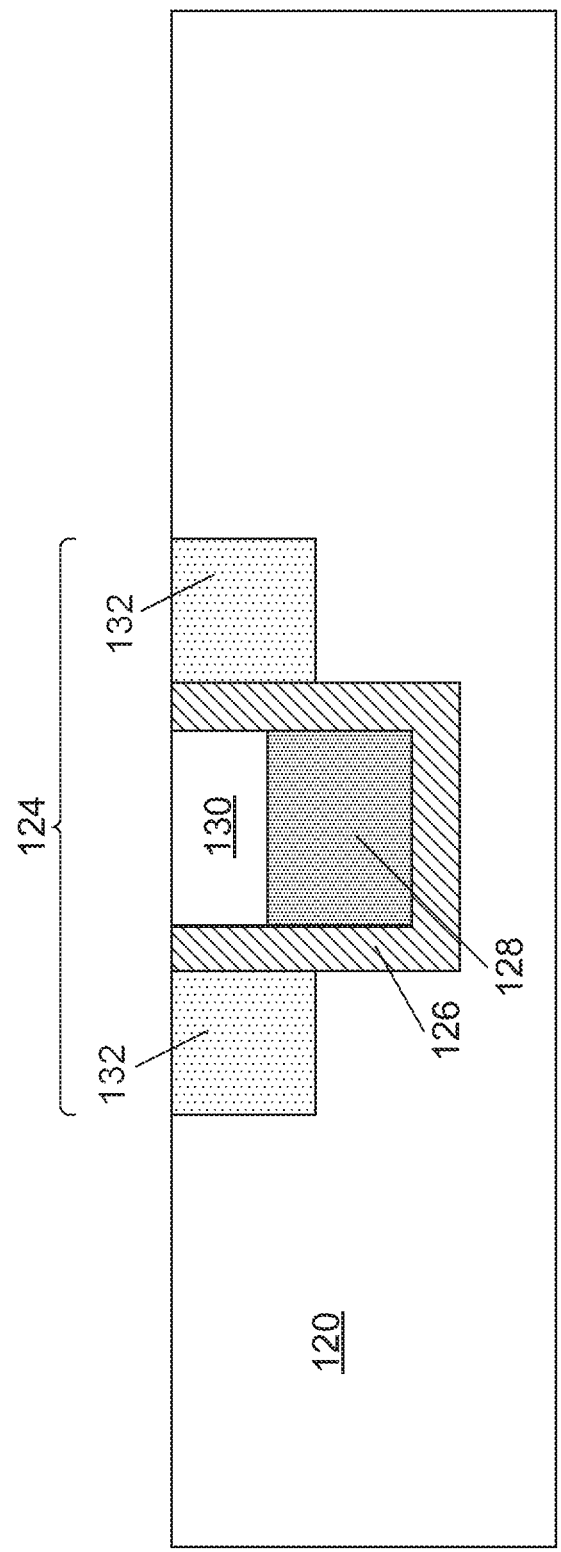
FIG. 1E is a cross section view illustrating an embedded transistor.

In an example, shown in FIG. 1E, a first trench of the one or more trenches may be filled with a gate insulator layer 126 on the bottom and sidewalls and a gate conductor layer 128 on the gate insulator layer 126. Generally, the gate insulator layer 126 may prevent electron depletion between source/drain regions and the gate electrode layer 128. In an embodiment, the gate insulator layer 126 may be composed of an oxide formed by an oxidation process or a high-k dielectric material. The gate electrode layer 128 may be composed of a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. A dielectric layer 130 may be formed on the gate electrode layer, such that an upper surface of the dielectric layer 130 is substantially flush with an upper surface of the substrate 120. The gate insulator layer 126, the gate electrode layer 128, and the dielectric layer 130 may be formed using a conventional deposition technique, such as, for example, chemical vapor deposition (CVD), plasma-enhanced CVD (PECVD), metal organic chemical vapor deposition (MOCVD), atomic layer deposition (ALD), evaporation, reactive sputtering, chemical solution deposition, spin-on deposition, or other like processes.

Portions of the substrate 120 on either side of the dielectric layer may be doped by implanting n-type or p-type dopants to form source/drain regions 132. For example, an n-type transistor may be formed by implanting an n-type ion such as phosphorous ions, at a dose of about 1E15 to about 5E15 atoms/cm$^2$ and at an energy of about 20 to about 100 KeV. A p-type transistor may be formed by p-type ions, such as boron ions, at a dose of about 1E15 to about 5E15 atoms/cm$^2$ and at an energy of about 10 to about 50 KeV.

The one or more trenches may also be filed with a conductive metal (e.g., gold, copper, silver, etc.) to form interconnects connecting one or more embedded transistors 124 with each other. Alternatively, the interconnects may be formed on top of the substrate 120. The interconnects may be formed such that the embedded transistors are arranged in a power gated crossbar pattern. The etching and deposition process described above may be performed from an upper surface of the substrate 120 or from a backside of the substrate 120. It should be noted that the embedded transistor shown in FIG. 1E is meant to be an illustrative example and any type of embedded transistor may be used.

The optical isolation layer 122 may be formed on an upper surface of the substrate 120. The optical isolation layer 122 may be composed of any applicable optical isolation material such as distributed Bragg reflector (DBR) layers, a reflective material, and/or a absorptive material. As specific examples, the reflective materials may be a metal such as stainless steel, gold, silver, titanium, or aluminum. The DBR layers may include, but are not limited to, layers of $SiO_2$ and $TiO_2$; $SiO_2$ and $ZrO_2$; SiC and MgO; SiC and Silica; GaAs and AlAs; ITO; or a-Si and a-Si. The optical isolation layer 122 may be formed using a conventional deposition technique, such as, for example, CVD, PECVD, MOCVD, ALD, evaporation, reactive sputtering, chemical solution deposition, spin-on deposition, or other like processes. In an example, the interconnects described above may contact and/or extend through the optical isolation layer.

Figure 1F:
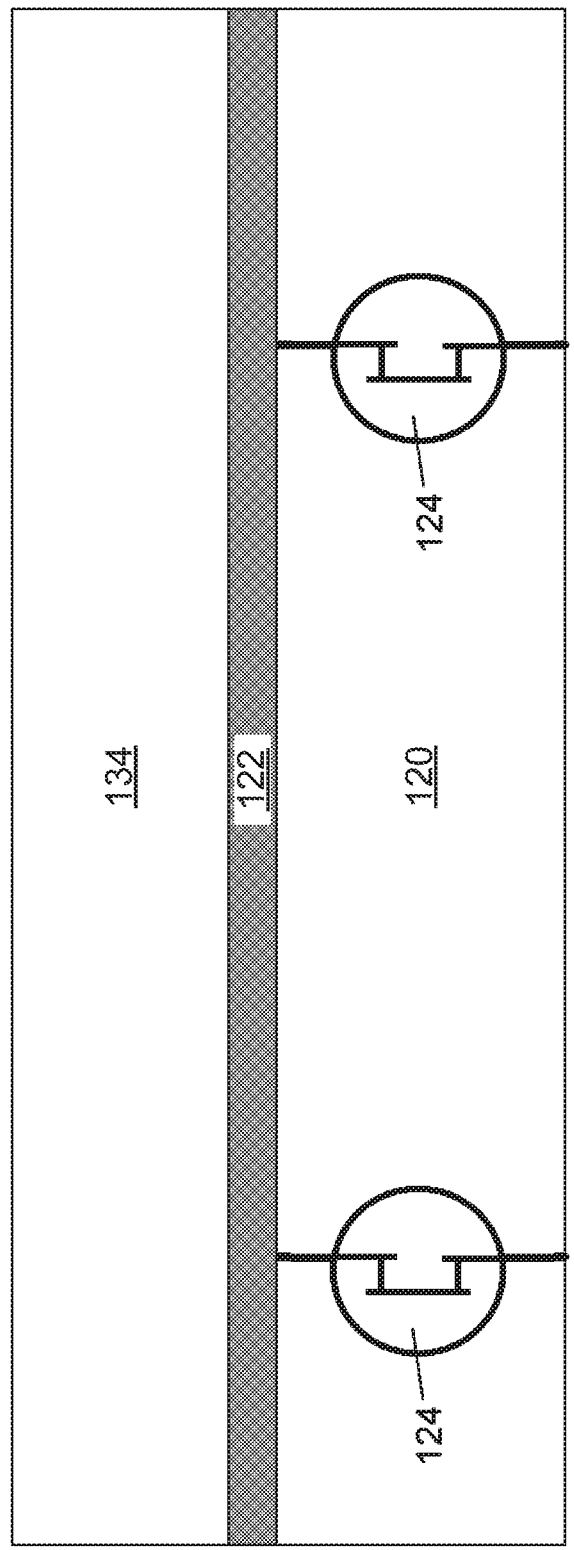
FIG. 1F is a cross section view illustrating forming a first semiconductor layer on the optical isolation layer.

Referring now to FIG. 1F, a cross section view illustrating forming a first semiconductor layer 134 on the optical isolation layer 122 is shown. The first semiconductor layer 134 may be composed of any Group III-V semiconductors, including binary, ternary, and quaternary alloys of gallium, aluminum, indium, and nitrogen, also referred to as III-nitride materials. For example, the first semiconductor layer 134 may be composed of III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors may have indices of refraction ranging from about 2.4 to about 4.1 at the typical emission wavelengths of LEDs in which they are present. For example, III-nitride semiconductors, such as GaN, may have refractive indices of about 2.4 at 500 nm, and III-phosphide semiconductors, such as InGaP, may have refractive indices of about 3.7 at 600 nm. In an example, the first semiconductor layer 134 may be composed of GaN.

The semiconductor layer 134 may be formed using conventional deposition techniques, such as MOCVD, MBE, or other epitaxial techniques. In an epitaxial deposition process, chemical reactants provided by one or more source gases are controlled and the system parameters are set so that depositing atoms arrive at a deposition surface with sufficient energy to move around on the surface and orient themselves to the crystal arrangement of the atoms of the deposition surface. Accordingly, the first semiconductor layer 134 may be grown on the optical isolation layer 122 using conventional epitaxial techniques. The first semiconductor layer 134 may be doped with n-type dopants.

Figure 1G:
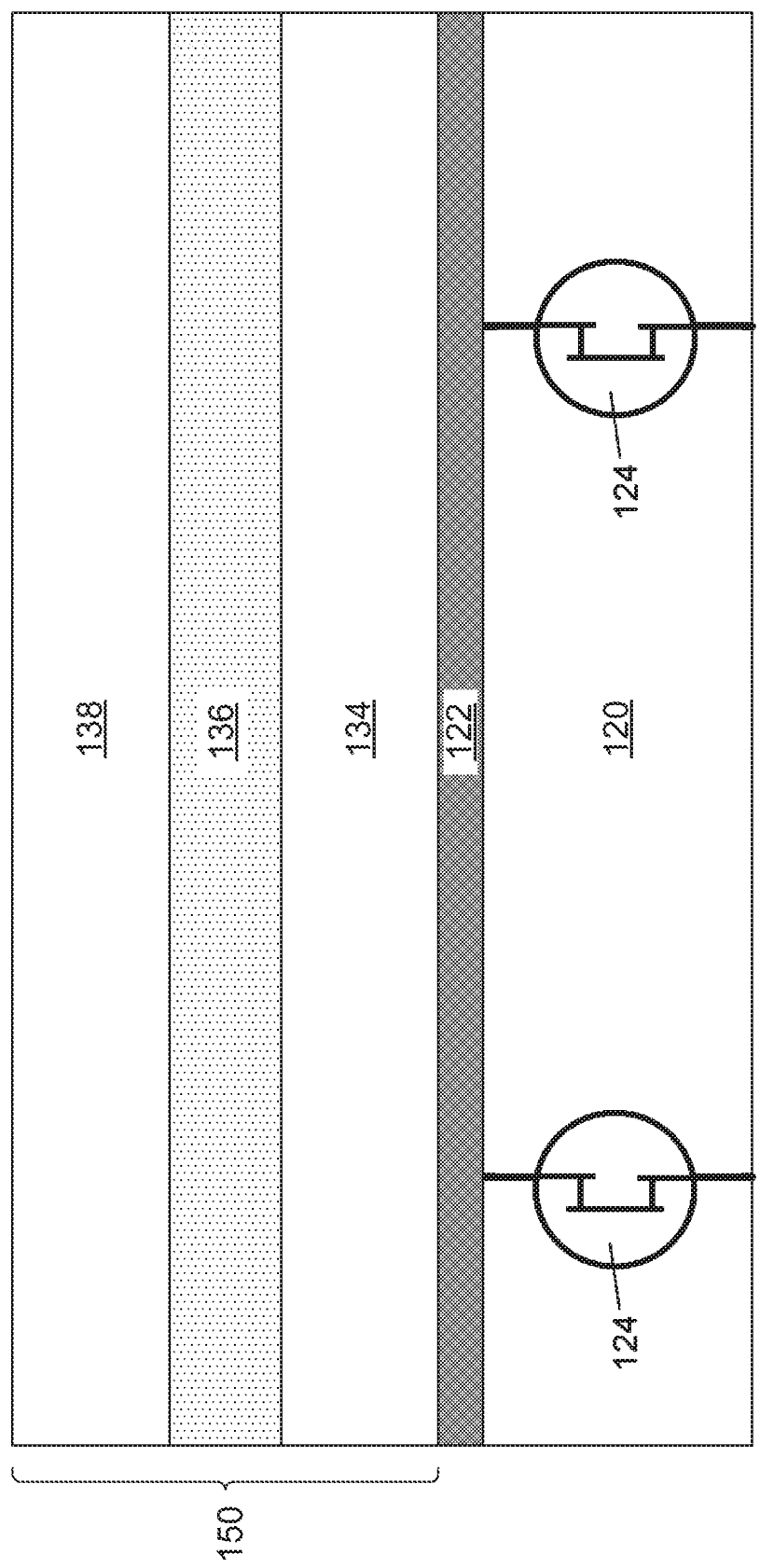
FIG. 1G is a cross section view illustrating forming a second semiconductor layer and an active region on the first semiconductor layer.

Referring now to FIG. 1G, a cross section view illustrating forming a second semiconductor layer 138 and an active region 136 on the first semiconductor layer 134 is shown. The second semiconductor layer 138 and the active region 136 may be composed of any Group III-V semiconductors, including binary, ternary, and quaternary alloys of gallium, aluminum, indium, and nitrogen, also referred to as III-nitride materials. For example, the second semiconductor layer 138 and the active region 136 may be composed of III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, CdTe, group IV semiconductors including but not limited to Ge, Si, SiC, and mixtures or alloys thereof. These semiconductors may have indices of refraction ranging from about 2.4 to about 4.1 at the typical emission wavelengths of LEDs in which they are present. For example, III-nitride semiconductors, such as GaN, may have refractive indices of about 2.4 at 500 nm, and III-phosphide semiconductors, such as InGaP, may have refractive indices of about 3.7 at 600 nm. In an example, the second semiconductor layer 138 and the active region 136 may be composed of GaN.

The second semiconductor layer 138 and the active region 136 may be formed using conventional deposition techniques, such as MOCVD, MBE, or other epitaxial techniques. In an epitaxial deposition process, chemical reactants provided by one or more source gases are controlled and the system parameters are set so that depositing atoms arrive at a deposition surface with sufficient energy to move around on the surface and orient themselves to the crystal arrangement of the atoms of the deposition surface. The active region 136 and the second semiconductor layer 138 may be formed along with the first semiconductor layer 134 or may be formed separately. The active region 136 and the second semiconductor layer 138 may be composed of a similar semiconductor material as the first semiconductor layer 134 or their composition may vary.

The second semiconductor layer 138 may be doped with p-type dopants. Accordingly, the active region 136 may be a p-n diode junction associated with the interface of the first semiconductor layer 134 and the second semiconductor layer 138. Alternatively, the active region 136 may include one or more semiconductor layers that are doped n-type, doped p-type, or are undoped. The active region 136 may emit light upon application of a suitable voltage through the first semiconductor layer 134 and the second semiconductor layer 138. In alternative implementations, the conductivity types of the first semiconductor layer 134 and the second semiconductor layer 138 may be reversed. That is, the first semiconductor layer 134 may be a p-type layer and the second semiconductor layer 138 may be an n-type layer. The first semiconductor layer 134, the active region 136, and the second semiconductor layer 138 may be collectively referred to as an epitaxial layer 150. The epitaxial layer 150 may be similar to the epitaxial layer 1011 described above with FIG. 1B and may be formed using similar methods.

Figure 1H:
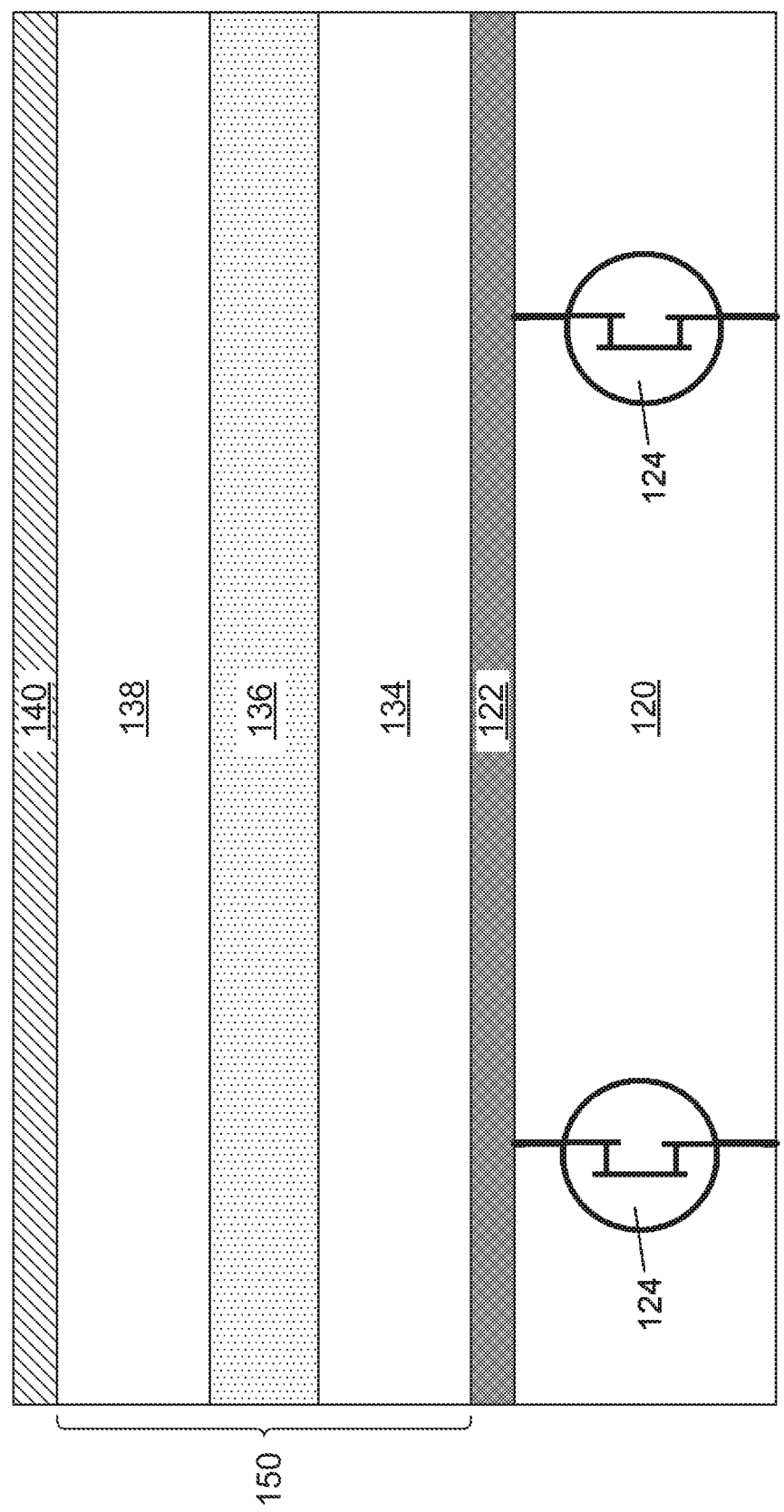
FIG. 1H is a cross section view illustrating forming a common contact layer on the second semiconductor layer.
Figure 11:
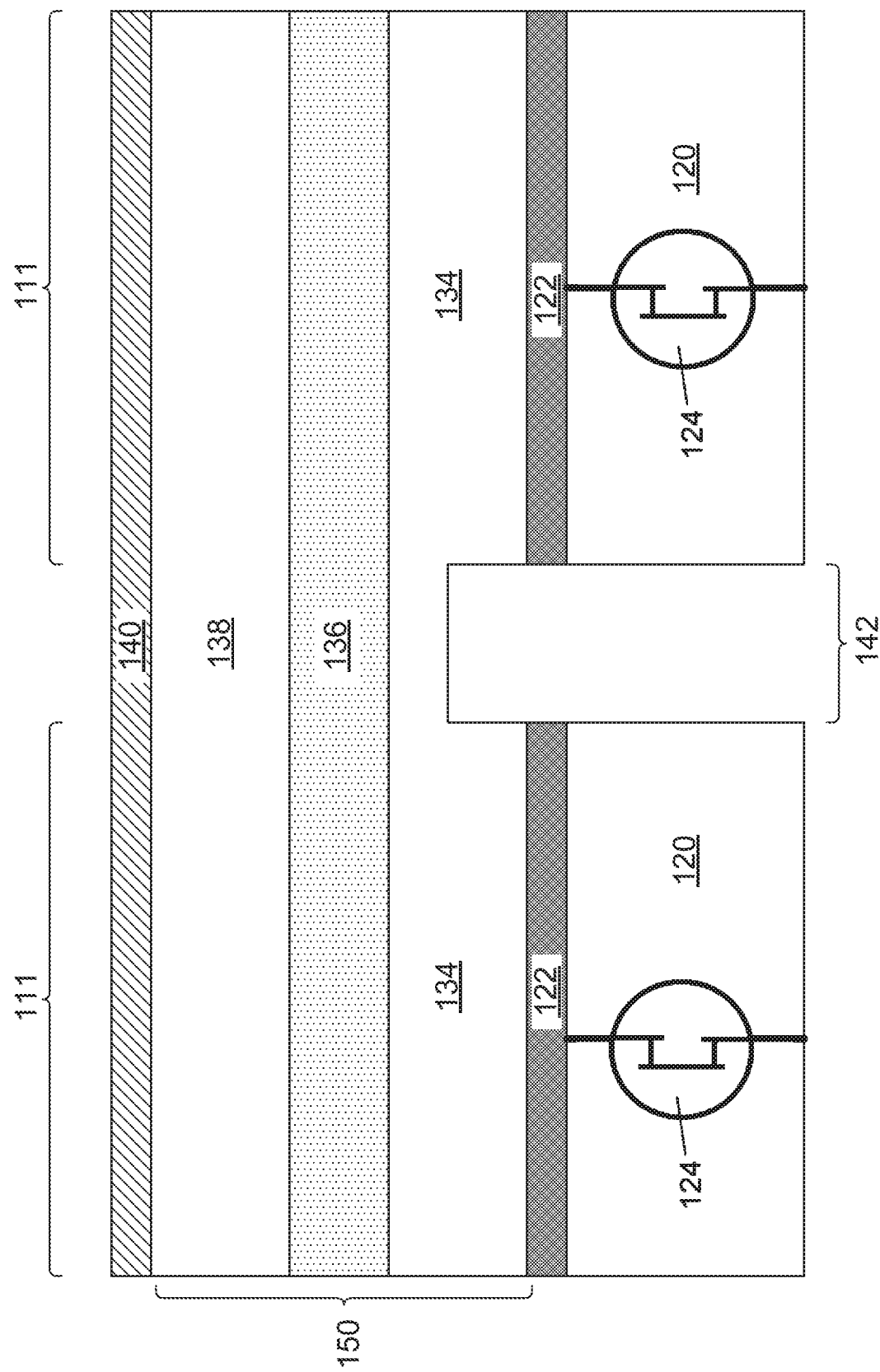

Referring now to FIG. 1H, a cross section view illustrating forming a common contact layer 140 on the second semiconductor layer 138 is shown. The common contact layer 140 may be composed of a blanket transparent conductor. In an example, the common contact layer 140 may be composed of a transparent conductive oxide (TCO), such as indium tin oxide (ITO). The common contact layer 140 may be formed using a conventional deposition technique, such as, for example, CVD, PECVD, MOCVD, ALD, evaporation, reactive sputtering, chemical solution deposition, spin-on deposition, or other like processes. The common contact layer 140 may be a n-type contact or may be a p-type contact depending on the arrangement of the first semiconductor layer 134 and the second semiconductor layer 138.

Referring now to FIG. 1I, a cross section view illustrating the formation of a trench 142 is shown. The trench 142 may separate one embedded transistor 124 from another. The trench 142 may extend through an entire thickness of the substrate 120, an entire thickness of the optical isolation layer 122, and a portion of the first semiconductor layer 134. The trench 142 may define one or more of the pixels 111.

In an example, the trench 142 may be formed by etching through the entire thickness of the substrate 120, the entire thickness of the optical isolation layer 122, and at least a portion of the first semiconductor layer 134. The trench 142 may be formed using a conventional etching process, such as, for example, wet etching, plasma etching, and reactive ion etching (RIE).

Figure 1J:
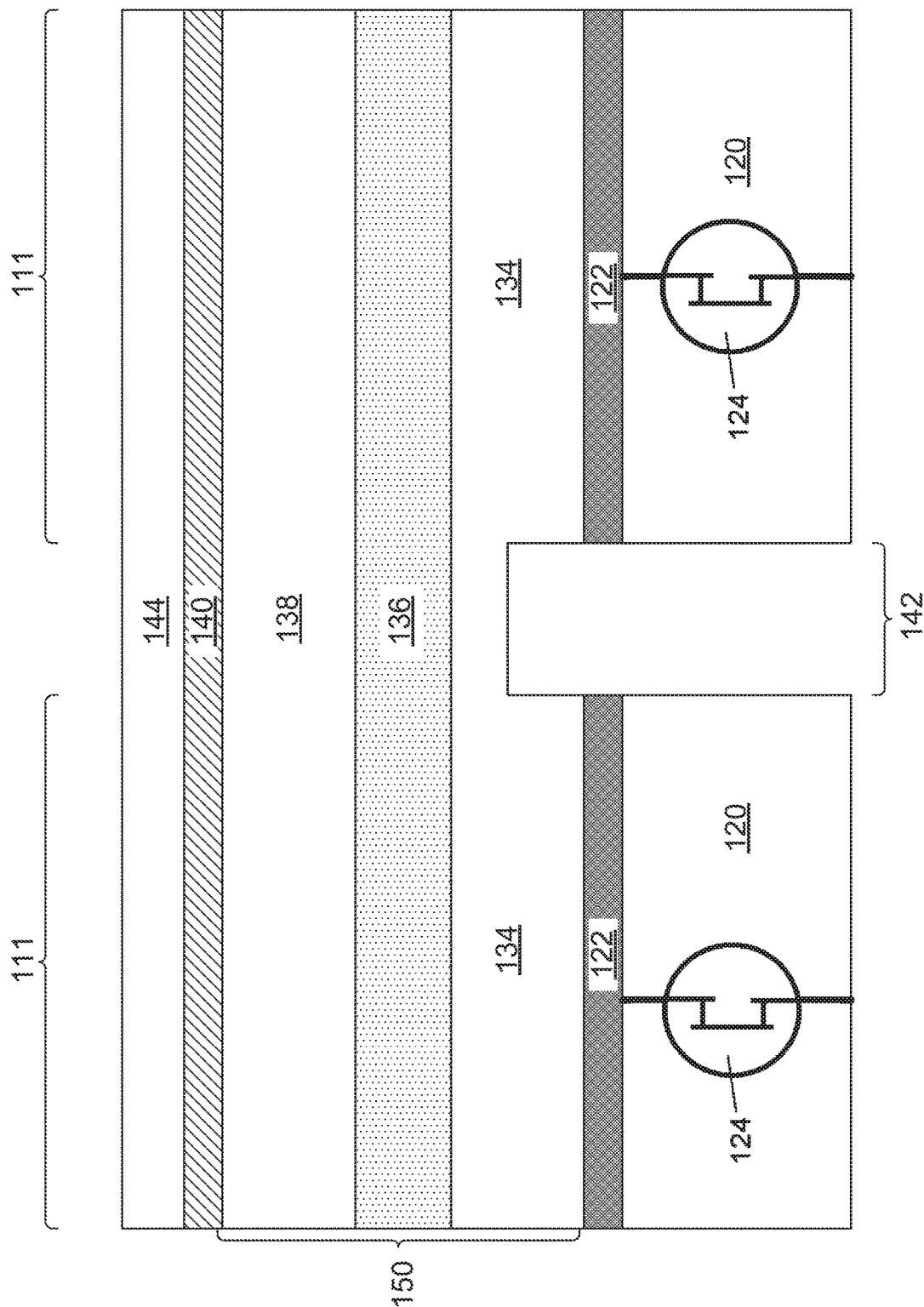
FIG. 1J is a cross section view illustrating forming a wavelength converting layer on the common contact layer.

Referring now to FIG. 1J, a cross section view illustrating forming a wavelength converting layer 144 on the common contact layer 140 is shown. The wavelength converting layer 144 may be composed of elemental phosphor or compounds thereof. The wavelength converting layer 144 may be formed using a conventional deposition technique, such as, for example, CVD, plasma enhanced chemical vapor deposition (PECVD), MOCVD, atomic layer deposition (ALD), evaporation, reactive sputtering, chemical solution deposition, spin-on deposition, or other like processes. The wavelength converting layer 144 may contain one or more phosphors. Phosphors are luminescent materials that may absorb an excitation energy (usually radiation energy), and then emit the absorbed energy as radiation of a different energy than the initial excitation energy. The phosphors may have quantum efficiencies near 100%, meaning nearly all photons provided as excitation energy may be reemitted by the phosphors. The phosphors may also be highly absorbent. Because the light emitting active region 136 may emit light directly into the highly efficient, highly absorbent wavelength converting layer 144, the phosphors may efficiently extract light from the device. The phosphors used in the wavelength converting layer 144 may include, but are not limited to any conventional green, yellow, and red emitting phosphors.

The wavelength converting layer 144 may be formed by depositing grains of phosphor on the on the common contact layer 140. The phosphor grains may be in direct contact with common contact layer 140, such that light emitted from the active region 136 may be directly coupled to the phosphor grains. Although not shown in FIG. 1J, an optical coupling medium may be provided to hold the phosphor grains in place. The optical coupling medium may be selected to have a refractive index that is as close as possible without significantly exceeding the index of refraction of the first semiconductor layer 134. For most efficient operation, no lossy media may be included between the first semiconductor layer 134, the phosphor grains of the wavelength converting layer 144, and the optical coupling medium.

The phosphor grains may have a grain size between 0.1 µm and 20 µm. The phosphor grains may be applied by, for example, electrophoretic deposition, spin coating, spray coating, screen printing, or other printing techniques to form the wavelength converting layer 144. In techniques such as spin coating or spray coating, the phosphor may be disposed in a slurry with an organic binder, which may then evaporated after deposit of the slurry by, for example, heating.

Optionally, the optical coupling medium may then be applied. Phosphor particles may be nanoparticles themselves (i.e., particles ranging from 100 nm to 1000 nm in size). Spherical phosphor particles, typically produced by spray pyrolysis methods or other methods can be applied, yielding a layer with a high package density which provides advantageous scattering properties. Also, phosphors particles may be coated, for example with a material with a band gap larger than the light emitted by the phosphor, such as $SiO_2$, $Al_2O_3$, $MePO_4$ or -polyphosphate, or other suitable metal oxides.

The wavelength converting layer 144 may be a ceramic phosphor, rather than a phosphor powder. A ceramic phosphor may be formed by heating a powder phosphor at high pressure until the surface of the phosphor particles begin to soften and melt. The partially-melted particles may stick together to form a rigid agglomerate of particles. Uniaxial or isostatic pressing steps and vacuum sintering of the preformed "green body" may be necessary to form a polycrystalline ceramic layer. The translucency of the ceramic phosphor (i.e., the amount of scattering it produces) may be controlled from high opacity to high transparency by adjusting the heating or pressing conditions, the fabrication method, the phosphor particle precursor used, and the suitable crystal lattice of the phosphor material. Besides phosphor, other ceramic forming materials such as alumina may be included, for example to facilitate formation of the ceramic or to adjust the refractive index of the ceramic.

The wavelength converting layer 144 may be composed of a mixture of silicone and phosphor particles. In this example, the wavelength converting layer 144 may be diced from plates and placed on the common contact layer 140. It should be noted that although the wavelength converting layer 144 is shown as a continuous layer, the composition may very over each pixel 111. In another example, the wavelength converting layer 144 may be separated by one or more isolation structures, such that each pixel 111 has a discreet wavelength converting layer 144. It should be noted that the formation of the wavelength converting layer 144 is an optional step and the wavelength converting layer may not be presented in the final structure.

Figure 1K:
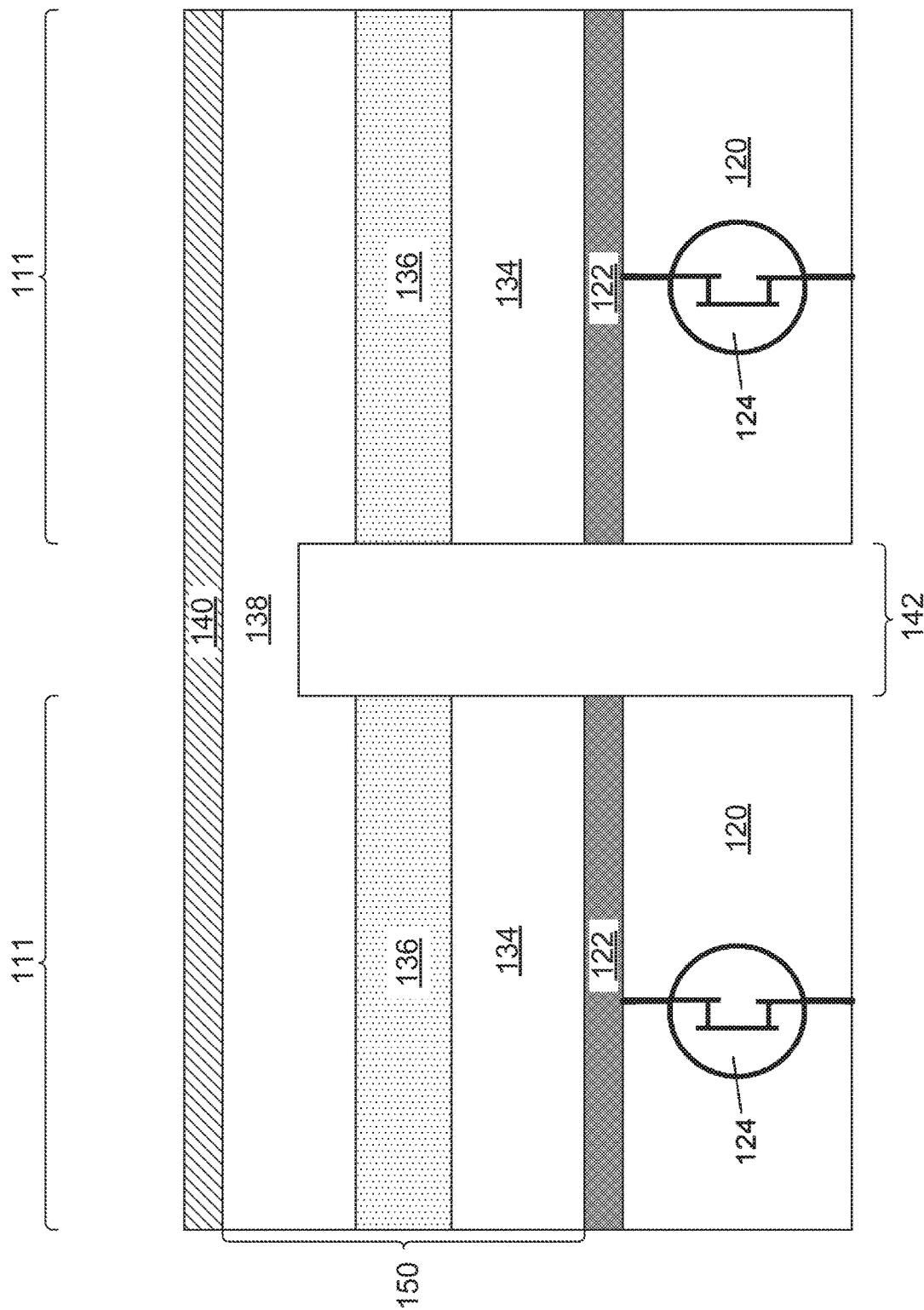
FIG. 1K is a cross section view illustrating the formation of a trench.

Referring now to FIG. 1K, a cross section view illustrating another example of forming the trench 142 is shown. The trench 142 may separate one embedded transistor 124 from another. The trench 142 may extend through an entire thickness of the substrate 120, an entire thickness of the optical isolation layer 122, an entire thickness of the first semiconductor layer 134, an entire thickness of the active region 136, and a portion of the second semiconductor layer 138. The trench 142 may define one or more of the pixels 111. The trench 142 may be formed using a conventional etching process, such as, for example, wet etching, plasma etching, and reactive ion etching (RIE).

Figure 1L:
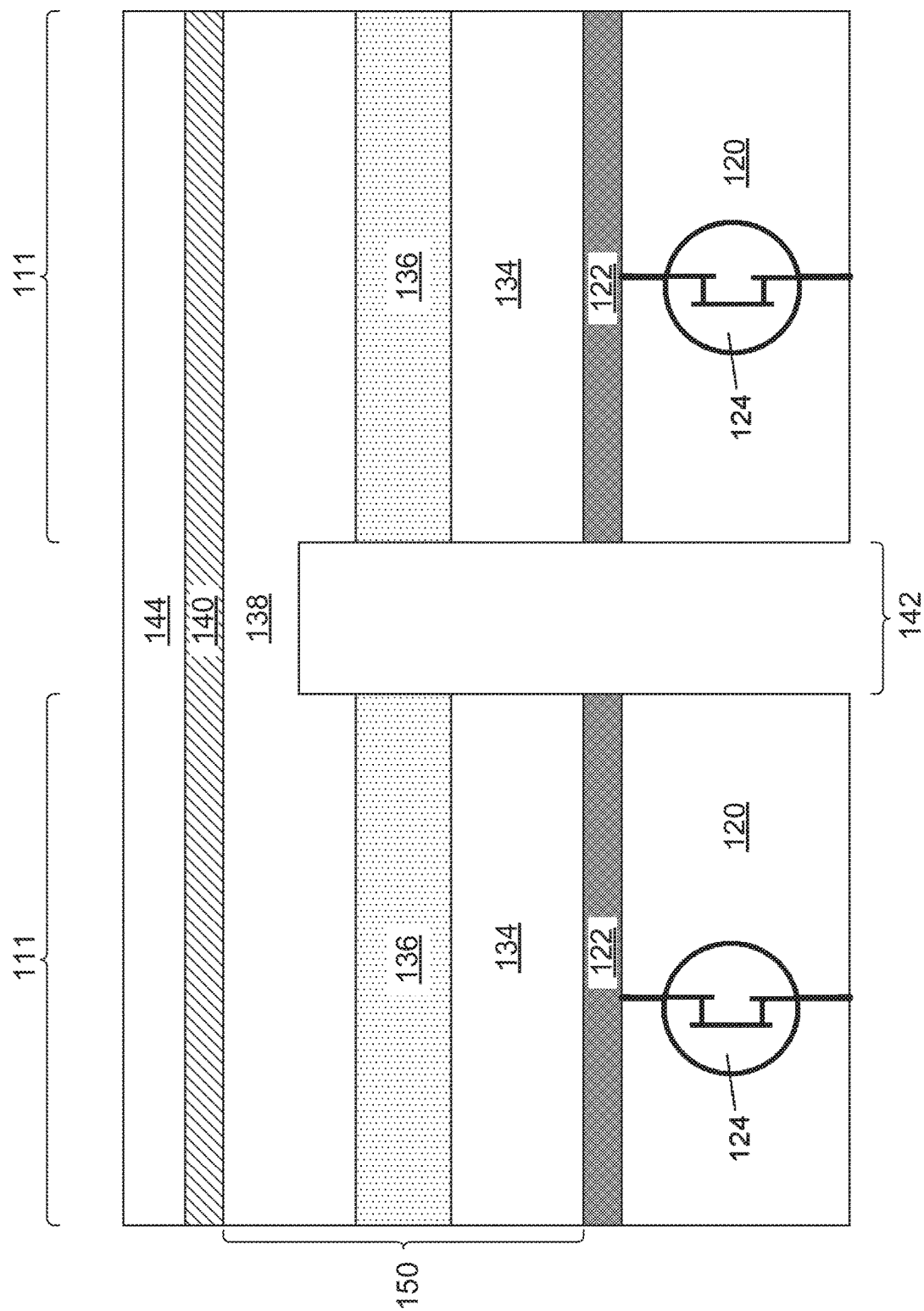
FIG. 1L is a cross section view illustrating forming a wavelength converting layer on the common contact layer.

Referring now to FIG. 1L, a cross section view illustrating forming a wavelength converting layer 144 on the common contact layer 140 is shown. The wavelength converting layer 144 may be similar to the wavelength converting layer 144 described with reference to FIG. 1J and may be formed using similar methods.

Figure 1M:
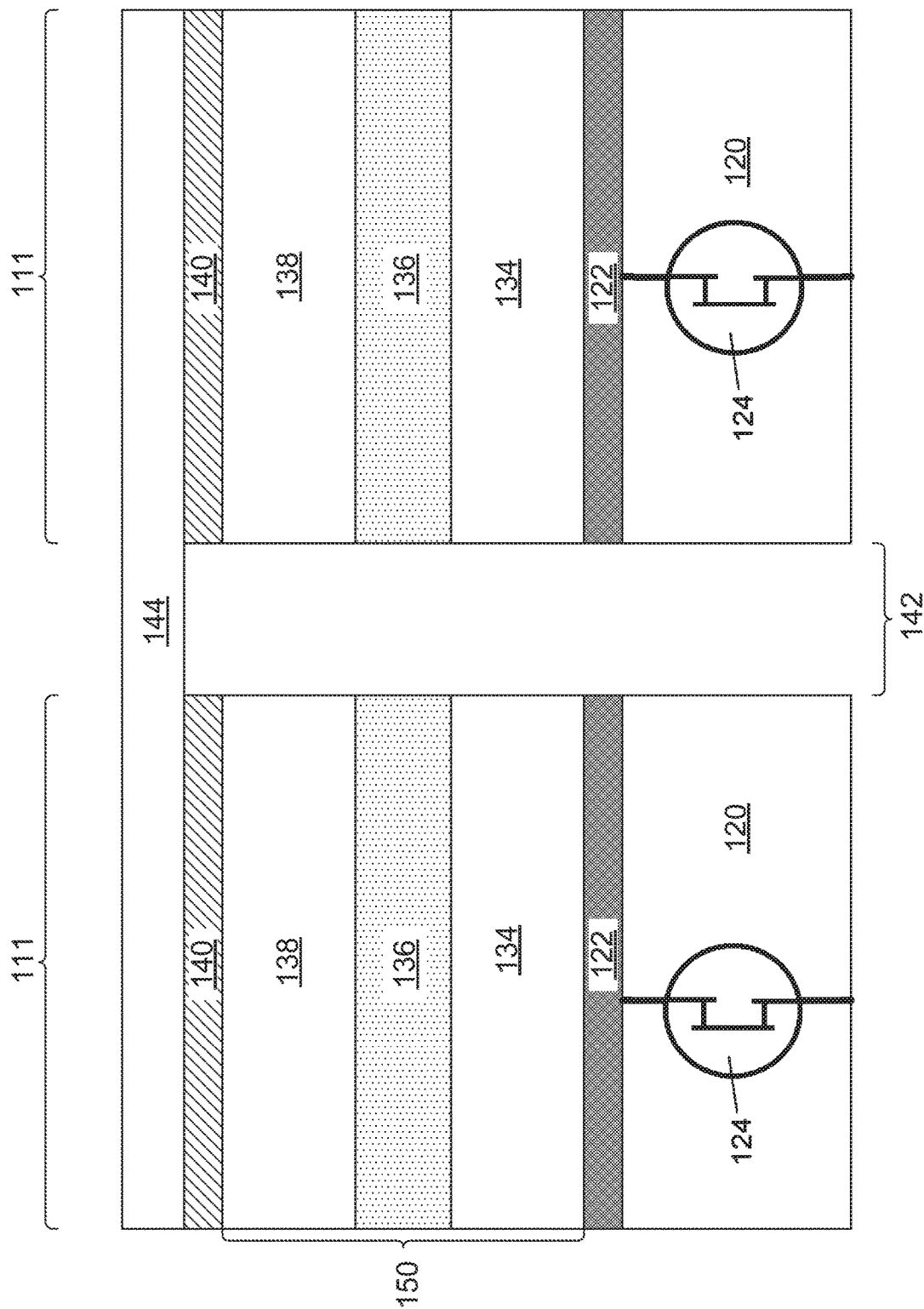
FIG. 1M is a cross section view illustrating the formation of a trench.
Figure 10:
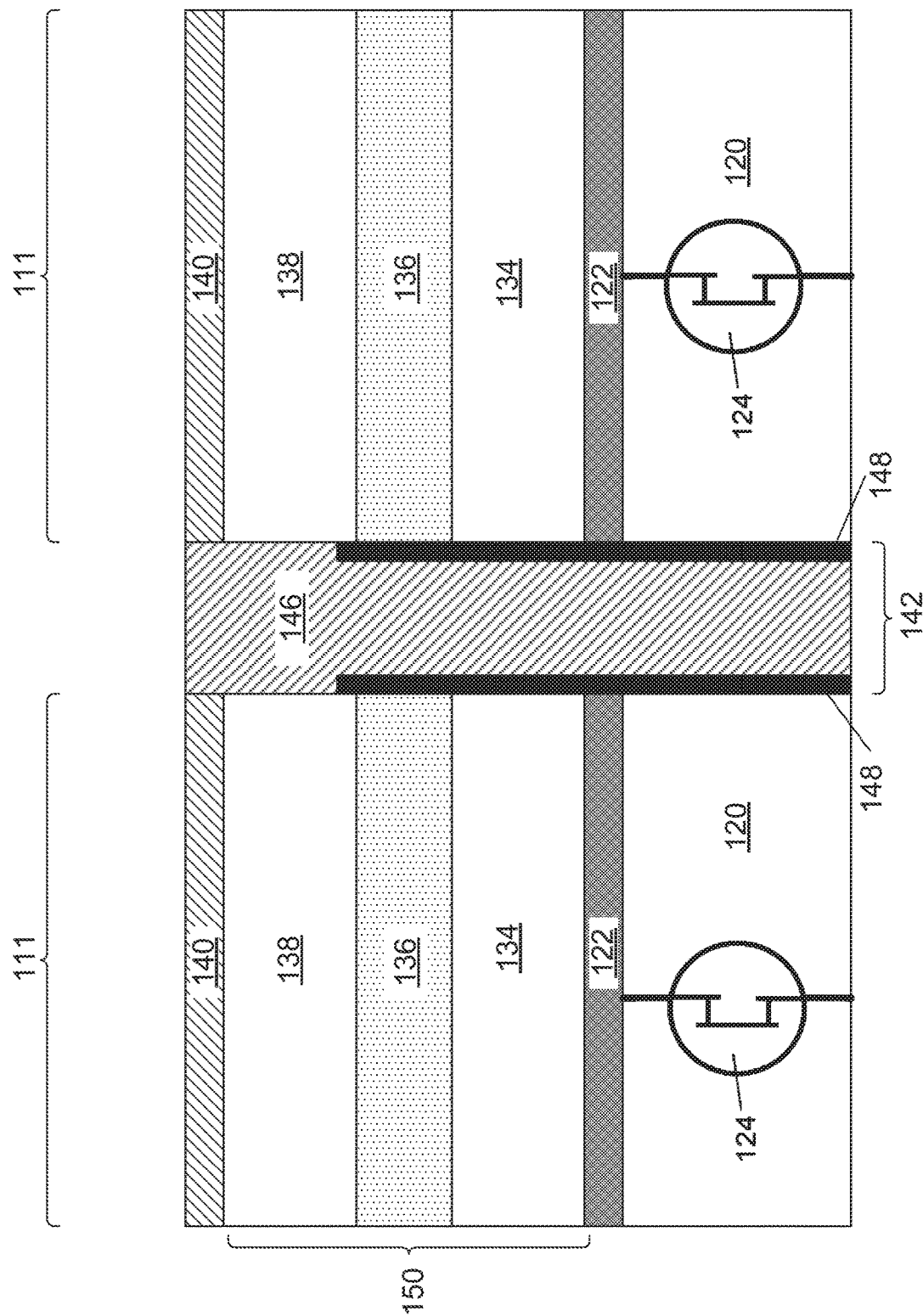

Referring now to FIG. 1M, a cross section view illustrating another example of forming the trench 142 is shown. The trench 142 may separate one embedded transistor 124 from another. The trench 142 may extend through an entire thickness of the substrate 120, an entire thickness of the optical isolation layer 122, an entire thickness of the first semiconductor layer 134, an entire thickness of the active region 136, an entire thickness of the second semiconductor layer 138, and an entire thickness of the common contact layer 140. The trench 142 may define the one or more of the pixels 111. The trench 142 may be formed using a conventional etching process, such as, for example, wet etching, plasma etching, and reactive ion etching (RIE). The wavelength converting layer 144 may be formed over the trench 142.

Referring now to FIG. 1N, a cross section view illustrating another example of forming the trench 142 is shown. The trench 142 may separate one embedded transistor 124 from another. The trench 142 may extend through an entire thickness of the substrate 120, an entire thickness of the optical isolation layer 122, an entire thickness of the first semiconductor layer 134, an entire thickness of the active region 136, an entire thickness of the second semiconductor layer 138, and an entire thickness of the common contact layer 140. The trench 142 may define the one or more of the pixels 111. The trench 142 may be formed using a conventional etching process, such as, for example, wet etching, plasma etching, and reactive ion etching (RIE).

Referring now to FIG. 1O, a cross section view illustrating forming a contact 146 within the trench of FIG. 1N is shown. The contact 146 may be c similar to the n type contacts 1040 described above with reference to FIG. 1B and may be formed using similar methods. One or more passivation layers 148 may fully or partially separate the contact 146 from the epitaxial layer 150. The one or more passivation layers 148 may be similar to the one or more passivation layers 1019 described above with reference to FIG. 1B and may be formed using similar methods.

Figure 1P:
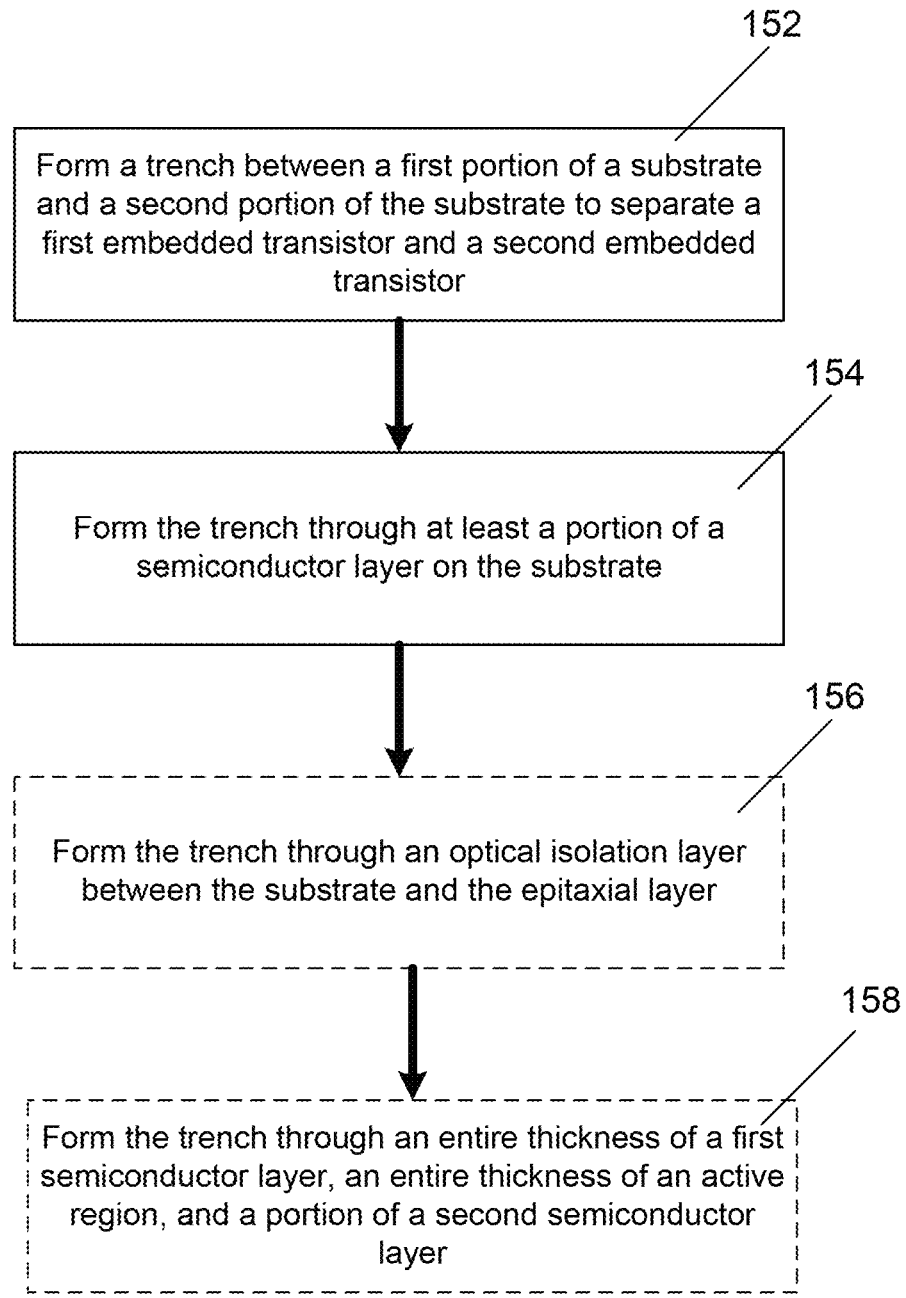
FIG. 1P is a flowchart illustrating a method of forming a device.

Referring now to FIG. 1P, a flowchart illustrating a method of forming a device is shown. In step 152, a trench may be formed between a first region of a substrate and a second region of a substrate. The first region may include a first embedded transistor and the second region may include a second embedded transistor. In step 154, the trench may be formed through at least a portion of a semiconductor layer formed on the substrate. In optional step 156, the trench may be formed through an optical isolation layer between the substrate and the epitaxial layer. In optional step 158, the trench may be formed through an entire thickness of a first semiconductor layer, an entire thickness of an active region, and a portion of a second semiconductor layer.

Figure 2A:
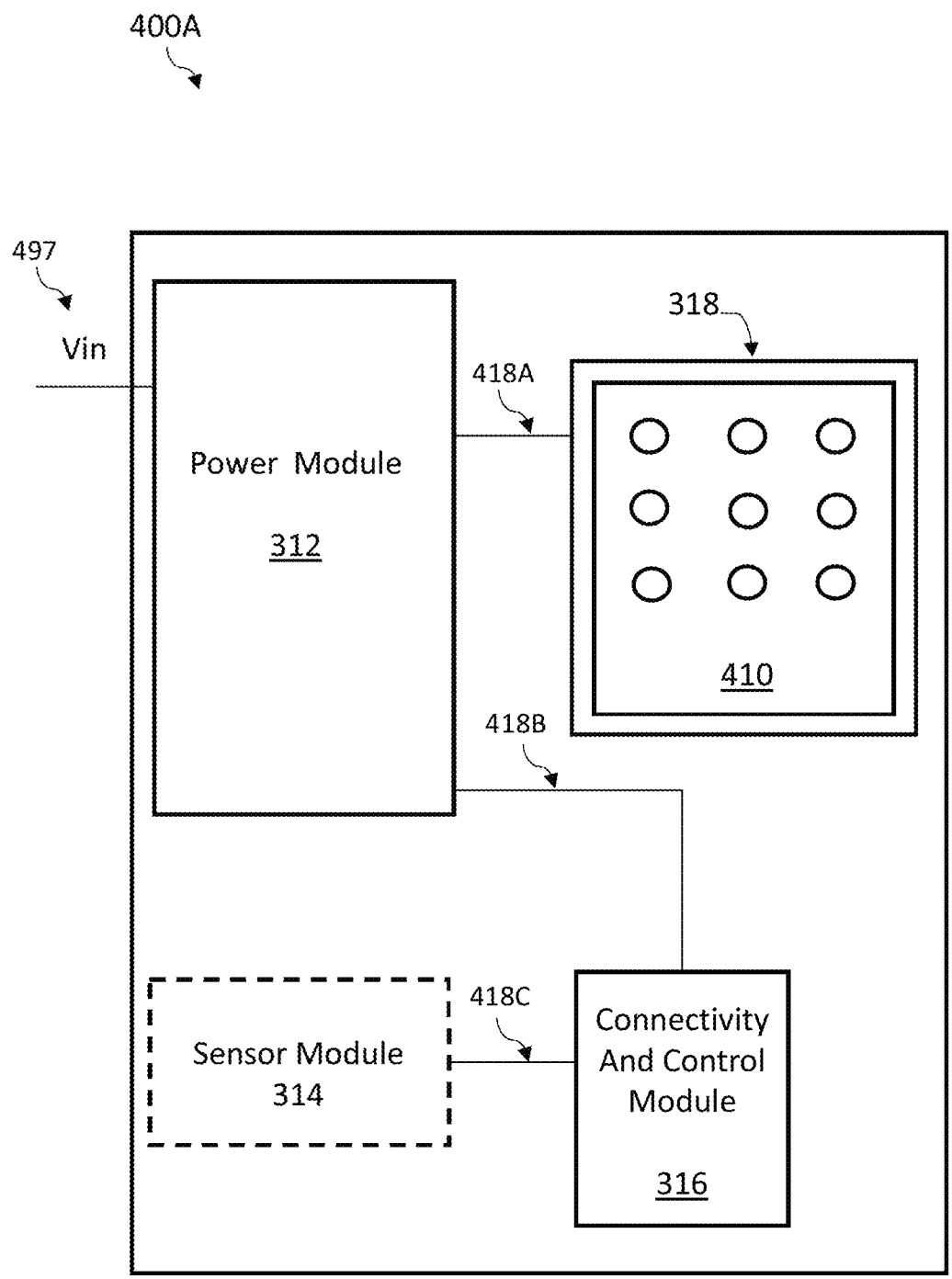
FIG. 2A is a top view of the electronics board with LED array attached to the substrate at the LED device attach region in one embodiment.

FIG. 2A is a top view of an electronics board with an LED array 410 attached to a substrate at the LED device attach region 318 in one embodiment. The electronics board together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 2A, the connectivity and control module 316 receives sensor signals from the sensor module 314 over trace 418O.

Figure 2B:
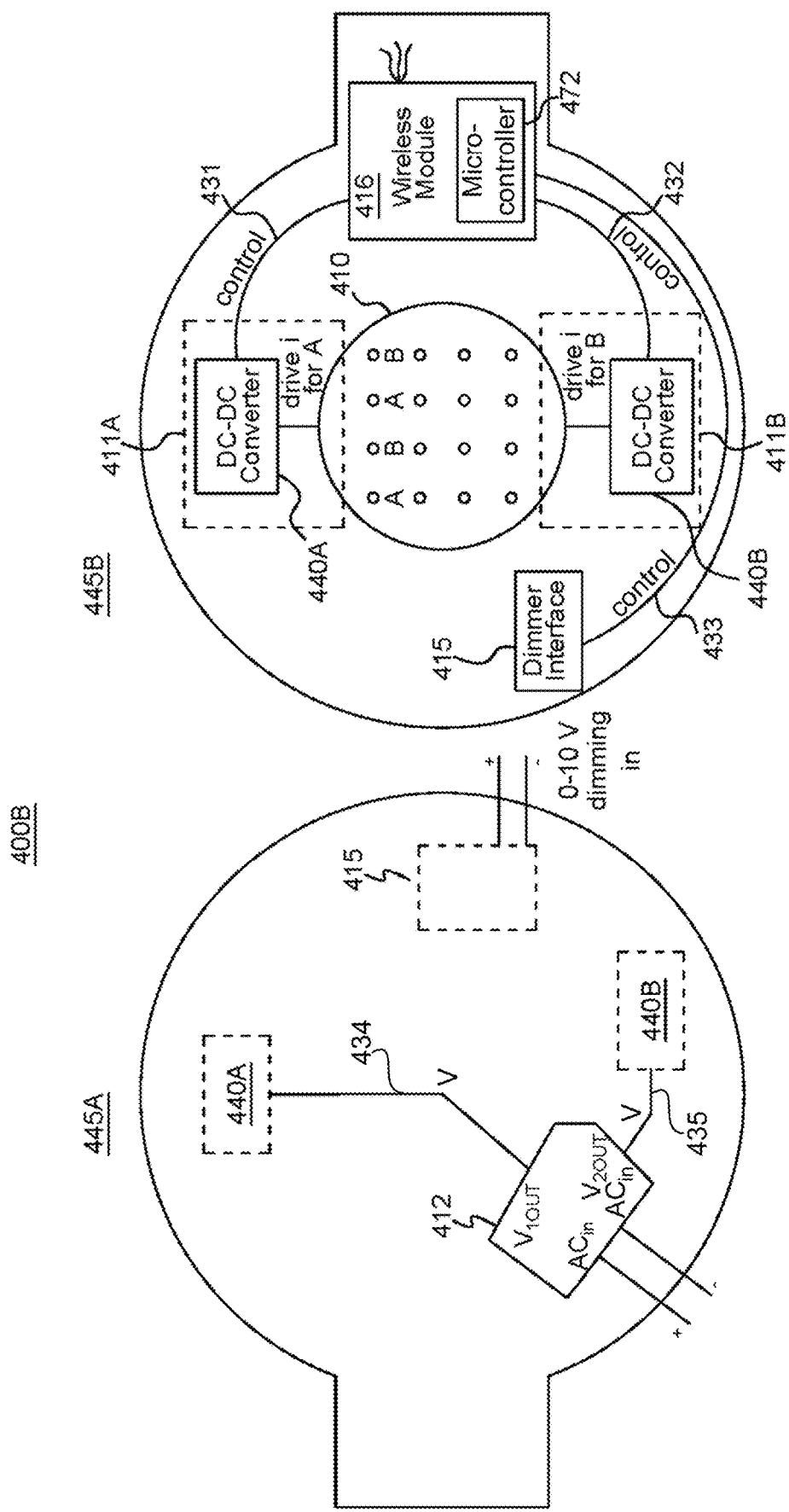
FIG. 2B is a diagram of one embodiment of a two channel integrated LED lighting system with electronic components mounted on two surfaces of a circuit board.

FIG. 2B illustrates one embodiment of a two channel integrated LED lighting system with electronic components mounted on two surfaces 445A and 445B of a circuit board. As shown in FIG. 2B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 2B does not include a sensor module (as described in FIG. 2A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board may be electrically coupled for exchanging, for example, voltages, currents, and control signals between modules, by surface or subsurface interconnections, such as traces 431, 432, 433, 434 and 435 or metallizations (not shown). Connections between modules on opposite surfaces of the circuit board may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 2C:
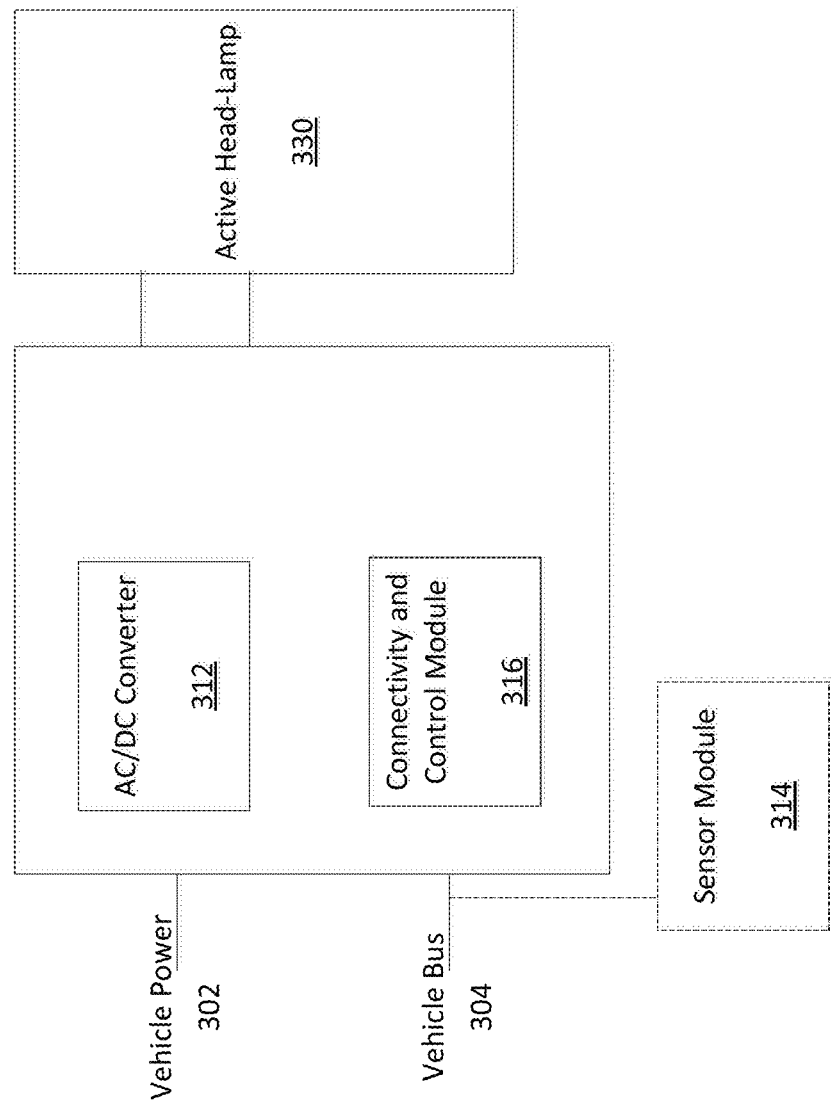
FIG. 2C is an example vehicle headlamp system.

FIG. 2C shows an example vehicle headlamp system 300 including a vehicle power 302 including a data bus 304. A sensor module 314 may be connected to the data bus 304 to provide data related to environment conditions (e.g. ambient light conditions, temperature, time, rain, fog, etc), vehicle condition (parked, in-motion, speed, direction), presence/position of other vehicles, pedestrians, objects, or the like. The sensor module 314 of FIG. 2C may be similar to or the same as the sensor module 314 of FIG. 2A. AC/DC Converter 312 (which may be similar or the same as the power module 312 of FIG. 2A or the AC/DC converter 412 of FIG. 2B) may be connected to the vehicle power 302.

The AC/DC converter 312 of FIG. 2C may receive AC power from the vehicle power 302. It may convert the AC power to DC power as described in FIG. 2B for AC-DC converter 412. The vehicle head lamp system 300 may include an active head lamp 330 which receives one or more inputs provided by or based on the AC/DC converter 312, connectivity and control module 316, and/or sensor module 314. As an example, the sensor module 314 may detect the presence of a pedestrian such that the pedestrian is not well lit, which may reduce the likelihood that a driver sees the pedestrian. Based on such sensor input, the connectivity and control module 316 may output data to the active head lamp 330 using power provided from the AC/DC converter 312 such that the output data activates a subset of LEDs in an LED array contained within active head lamp 330. The subset of LEDs in the LED array, when activated, may emit light in the direction where the sensor module 314 sensed the presence of the pedestrian. These subset of LEDs may be deactivated or their light beam direction may otherwise be modified after the sensor module 314 provides updated data confirming that the pedestrian is no longer in a path of the vehicle that includes vehicle head lamp system.

Figure 3:
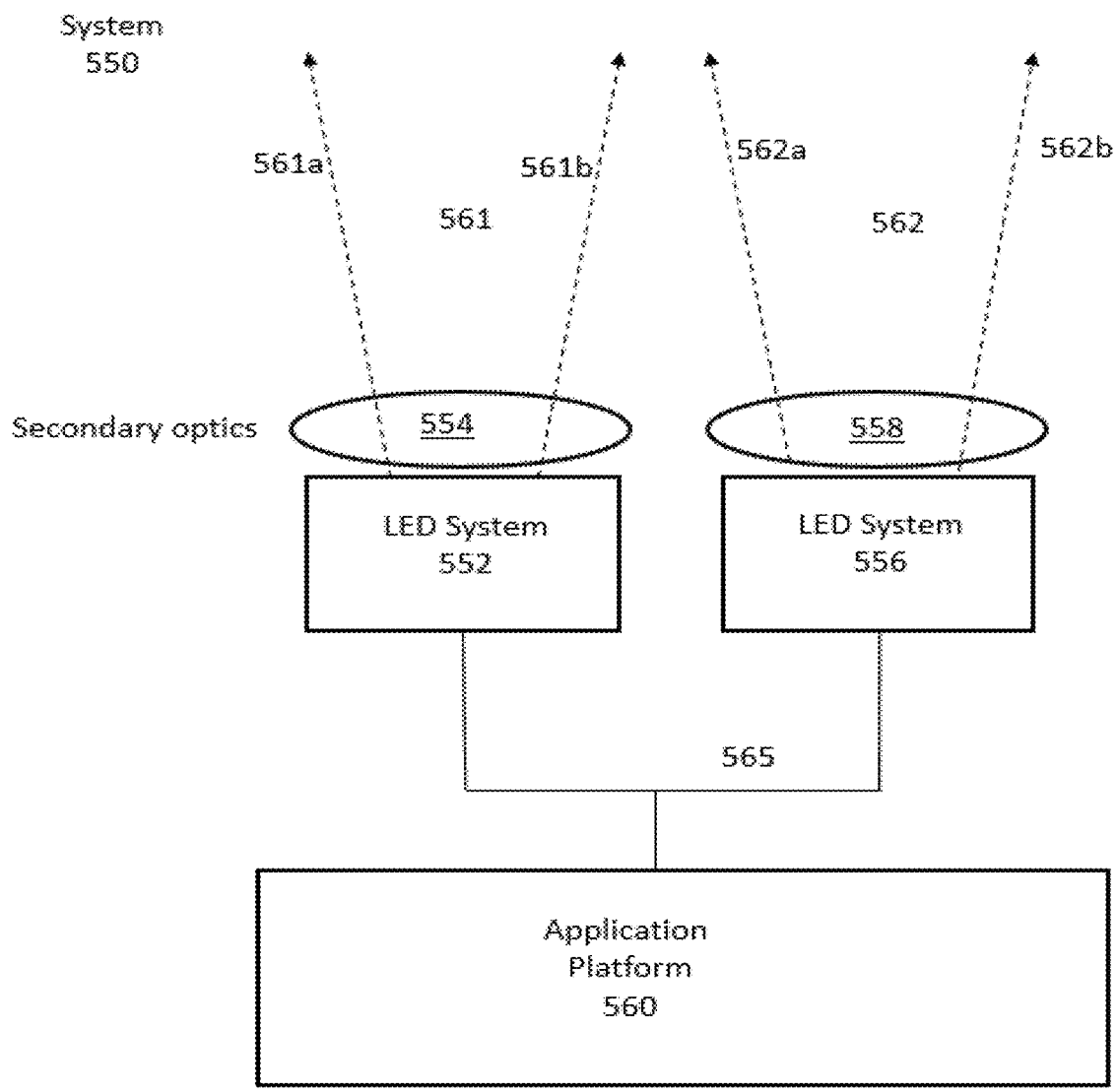
FIG. 3 shows an example illumination system.

FIG. 3 shows an example system 550 which includes an application platform 560, LED systems 552 and 556, and optics 554 and 558. The LED System 552 produces light beams 561 shown between arrows 561a and 561b. The LED System 556 may produce light beams 562 between arrows 562a and 562b. In the embodiment shown in FIG. 3, the light emitted from LED System 552 passes through secondary optics 554, and the light emitted from the LED System 556 passes through secondary optics 554. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 2A and vehicle head lamp system 300 shown in FIG. 2C illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560. Alternatively or in addition, as shown in the LED system 400 of FIG. 2A, each LED System 552 and 556 may include its own sensor module, connectivity and control module, power module, and/or LED devices.

In embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors (e.g., similar to sensor modules 314 of FIG. 2A and FIG. 2C) that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

The invention claimed is:

1. A device comprising:
a substrate;
one or more epitaxial layers on the substrate;
a first transistor embedded in a first region of the substrate; and
a second transistor embedded in a second region of the substrate, the first region and the second region separated by a trench extending entirely through the substrate and through one or more portions of the one or more epitaxial layers.

2. The device of claim 1, wherein the first embedded transistor is coupled to a first light emitting diode (LED) formed by corresponding portions of the one or more epitaxial layers on the first region of the substrate, and the second embedded transistor is coupled to a second LED formed by corresponding portions of the one or more epitaxial layers on the second region of the substrate.

3. The device of claim 1, further comprising:
a first optical isolation layer between the one or more epitaxial layers and the first region of the substrate; and
a second optical isolation layer between the one or more epitaxial layers and the second region of the substrate.

4. The device of claim 1, wherein the one or more epitaxial layers include:
a first semiconductor layer;
a second semiconductor layer, with the first semiconductor layer between the substrate and the second semiconductor layer; and
an active region between the first and second semiconductor layers.

5. The device of claim 4, wherein the trench extends through at least a portion of the first semiconductor layer.

6. The device of claim 4, wherein the trench extends through an entire thickness of the first semiconductor layer, an entire thickness of the active region, and at least a portion of the second semiconductor layer.

7. The device of claim 1, further comprising a common contact layer, with the one or more epitaxial layers between the substrate and the common contact layer.

8. The device of claim 7, wherein the trench extends through an entire thickness of the one or more epitaxial layers and an entire thickness of the common contact layer.

9. The device of claim 8, further comprising:
a contact in the trench; and
a passivation layer between the contact and the substrate and one or more portions of the one or more epitaxial layers.

10. The device of claim 7, further comprising a wavelength converting layer, with the common contact layer between the one or more epitaxial layers and the wavelength converting layer.

11. An LED array, comprising:
a substrate;
a first transistor embedded in a first region of the substrate;
a second transistor embedded in a second region of the substrate, the first and second regions of the substrate being separated by a trench extending entirely through the substrate and through at least a portion of a first semiconductor layer on the substrate;
a first LED positioned on the first region of the substrate, coupled to the first embedded transistor, and including a portion of the first semiconductor layer; and
a second LED positioned on the second region of the substrate, coupled to the second embedded transistor, and including a portion of the first semiconductor layer.

12. The LED array of claim 11, wherein (i) the first and second LEDs are less than about 100 µm wide, or (ii) the trench is less than about 20 µm wide.

13. The LED array of claim 11, further comprising:
a first optical isolation layer between the first semiconductor layer and the first region of the substrate; and
a second optical isolation layer between the first semiconductor layer and the second region of the substrate.

14. The LED array of claim 13, wherein each one of the first and second LEDs includes:
a corresponding region of the first semiconductor layer;
a corresponding region of a second semiconductor layer, with the first semiconductor layer between the substrate and the second semiconductor layer; and
a corresponding active region between the corresponding regions of the first and second semiconductor layers.

15. The LED array of claim 14, wherein the trench extends through an entire thickness of the first semiconductor layer, an entire thickness of the active region, and a portion of the second semiconductor layer.

16. The LED array of claim 12, further comprising a common contact layer, with the first LED and the second LED between the substrate and the common contact layer.

17. The device of claim 2, wherein (i) the first and second LEDs are less than about 100 μm wide, or (ii) the trench is less than about 20 μm wide.

\* \* \* \* \*

UNITED STATES PATENT AND TRADEMARK OFFICE
CERTIFICATE OF CORRECTION

| | |
|---|---|
| PATENT NO. | : 11,749,790 B2 |
| APPLICATION NO. | : 16/225934 |
| DATED | : September 5, 2023 |
| INVENTOR(S) | : Ashish Tandon, Luke Gordon and Yu-Chen Shen |

It is certified that error appears in the above-identified patent and that said Letters Patent is hereby corrected as shown below:

In the Claims

In Claim 16 (Column 17 Line 1):
Please replace "claim 12" with --claim 11--

Signed and Sealed this
Twenty-third Day of April, 2024

Katherine Kelly Vidal
*Director of the United States Patent and Trademark Office*